(12) United States Patent
Mendoza et al.

(10) Patent No.: US 7,039,289 B1
(45) Date of Patent: May 2, 2006

(54) INTEGRATED OPTIC DEVICES AND PROCESSES FOR THE FABRICATION OF INTEGRATED OPTIC DEVICES

(75) Inventors: Edgar A. Mendoza, Redondo Beach, CA (US); Lothar U. Kempen, Redondo Beach, CA (US); Frank W. Dabby, Los Angeles, CA (US)

(73) Assignee: Optinetrics, Inc., Torrance, CA (US)

( * ) Notice: Subject to any disclaimer, the term of this patent is extended or adjusted under 35 U.S.C. 154(b) by 375 days.

(21) Appl. No.: 09/941,349

(22) Filed: Aug. 28, 2001

Related U.S. Application Data

(63) Continuation of application No. 09/823,869, filed on Mar. 30, 2001, now abandoned, which is a continuation-in-part of application No. 09/574,841, filed on May 19, 2000, and a continuation-in-part of application No. 09/574,840, filed on May 19, 2000.

(51) Int. Cl.
*G02B 6/10* (2006.01)

(52) U.S. Cl. ......................... 385/132; 385/14; 430/321; 430/322

(58) Field of Classification Search .................. 385/14, 385/129–132; 430/270, 10, 5, 240, 321, 322, 430/326
See application file for complete search history.

(56) References Cited

U.S. PATENT DOCUMENTS

| | | | |
|---|---|---|---|
| 4,725,110 A | 2/1988 | Glenn et al. | |
| 5,080,503 A | 1/1992 | Najafi et al. | |
| 5,080,962 A | 1/1992 | Hench | |
| 5,151,958 A | 9/1992 | Honkanen | |
| 5,265,185 A | 11/1993 | Ashley | |
| 5,360,834 A | 11/1994 | Popall et al. | |

(Continued)

FOREIGN PATENT DOCUMENTS

| CA | 2218273 | 4/1999 |
|---|---|---|
| JP | 03-013907 A | 1/1991 |
| WO | WO 99/06873 | 2/1999 |

OTHER PUBLICATIONS

Mendoza E.A., Ferrell D.J., Syracuse S.J., Khalil A.N., Lieberman R.A., "Photolithography of Integrated Optice Devices in Sol–Gel Glasses," Proc. SPIE–Int. Soc. Opt. Eng., vol. 2288, pp. 580–588 (1994).

(Continued)

*Primary Examiner*—Rodney Bovernick
*Assistant Examiner*—Sung Pak
(74) *Attorney, Agent, or Firm*—Jones Day

(57) ABSTRACT

Processes for fabricating integrated optics devices are provided. According to one process, a photosensitive sol-gel glass material including a volatile photosensitizer is prepared. A film of the sol-gel is then produced on a substrate. The film is then imprinted with an image of an optical device by exposing the photosensitive sol-gel film to light energy patterned in the negative or positive image of the desired device, thereby photolyzing photosensitizer within the exposed portion in proportion to the amount of light energy delivered. The image of the written optical device is then fixed in the exposed film, thereby forming a planar device layer having an embedded optical device. The photoinduced refractive index change between the optical device and the surrounding region is preferably greater than or equal to 0.001. A variety of passive and active integrated optic devices may be fabricated using the disclosed processes and are also described.

44 Claims, 18 Drawing Sheets

U.S. PATENT DOCUMENTS

| | | | |
|---|---|---|---|
| 5,574,807 A | 11/1996 | Snitzer | |
| 5,585,640 A | 12/1996 | Huston et al. | |
| 5,620,495 A | 4/1997 | Aspell et al. | |
| 5,972,516 A | 10/1999 | Kanacko et al. | |
| 6,054,253 A | 4/2000 | Fardad et al. | |
| 6,103,363 A | 8/2000 | Boire et al. | |
| 6,115,518 A | 9/2000 | Calpp | |
| 6,158,245 A | 12/2000 | Savant | |
| 6,268,089 B1 | 7/2001 | Chandross et al. | |
| 6,368,775 B1 * | 4/2002 | Potter et al. | 430/322 |
| 2001/0031122 A1 * | 10/2001 | Lackritz et al. | 385/131 |
| 2001/0041025 A1 * | 11/2001 | Farahi | 385/14 |
| 2001/0047665 A1 | 12/2001 | Zhang et al.. | |
| 2003/0210881 A1 | 11/2003 | Mendoza et al. | |

OTHER PUBLICATIONS

Najafi, S.I., Touam T., Sara R., Andrews M.P., Fardad M.A., "Sol–Gel Glass Waveguide and Grating on Silicon," Journal of Lightwave Technology, vol. 16, No. 9 (1998).

McEntee J. "Sol–Gel Devices 'will meet cost targets of fibre to the home'," Opto & Laser Europe, Issue 31, p. 5 (1996).

Coudray, P., Chisham, J., Malek–Tabrizi, A., Li, C.–Y., Andrews, M.P., Peyghambarian, N., Najafi, S.I., "Ultraviolet Light Imprinted Sol–Gel Silica Glass Waveguide Devices on Silicon," Optics Comm., 128(1–3) 19–22 (1996).

Coudray, P., Chisham, J., Andrews, M.P., Najafi, S.I., "Ultraviolet Light Imprinted Sol–Gel Silica Glass Low–Loss Waveguides For Use At 1.55 μm," Opt. Eng. 36(4) 1234–1240 (1997).

Fardad, A., Andrews, M., Milova, G., Malek–Tabrizi A., Najafi, I., "Fabrication of Ridge Waveguides:: A New Solgel Route," Applied Optics, vol. 37, No. 12., pp. 2429–2434 (1998).

Najafi, S.I., Armenise, M.N., "Organoaluminophosphate sol–gel silica glass thin films for integrated optics," Proc. SPIE–Int. Soc. Opt. Eng., vol. 2997 pp. 79–84 (1997).

Cindrich I., Lee, S.H., Sutherland, R. L., "Adapting Existing E–Beam Writers to Write HEBS–Glass Gray Scale Masks," Proc. SPIE–Int. Soc. Opt. Eng., vol. 3633 pp. 35–45 (1999).

Kley, E–B., "Continuous Profile Writing by Electron and Optical Lithography," Microelectronic Engineering, 34 pp. 261–298 (1997).

Syms, R.R.A., "Silica–On Silicon Integrated Optics," Advances in Integrated Optics, pp. 121–150 (1994).

Najafi, S.I., Andrews, M.P., Fardad, M.A., Milova, G., Tahar, T., Coudray, P., "UV–Light Imprinted Surface, Ridge and Buried Sol–Gel Glass Waveguides and Devices on Silicon," Proc. SPIE–Int. Soc. Opt. Eng., vol. 2954 pp. 100–104 (1996).

Holmes, A.S., Syms, R.R.A., "Fabrication of Low–Loss Channel Waveguides in Sol–Gel Glass on Silicon Substrates," Advanced Materials in Optics, Electro–Optics and Communication Technologies (1995).

Holmes, A.S., Syms, R.R.A., Li, M., Green M., "Fabrication of Buried Channel Waveguides on Silicon Substrates Using Spin–On Glass," Applied Optics, vol. 32, No. 25 pp. 4916–4921 (1993).

Kawachi, M., "Silica Waveguides on Silicon and Their Application to Integrated–Optic Components," Optical and Quantum Electronics, vol. 22, No. 5, pp. 391–416 (1990).

Ballato, J., Dejneka, M., Riman,R.E., Snitzer, E., Zhou, W., "Sol–Gel Synthesis of Rare–Earth–Doped Fluoride Glass Thin Films," Journal of Materials Research, vol. 11, No. 4., pp. 841–849 (1996).

Yang, L., Saavedra, S.S., Armstrong, N.R., Hayes, J., "Fabrication and Characterization of Low–Loss, Sol–Gel Planar Waveguides," Anal. Chem. vol. 66, No. 8, pp. 1254–1263 (1994).

Schmidt, H., "Thin Films, the Chemical Processing up to Gelation," Structure and Bonding, vol. 77, pp. 119–151 (1992).

Chisham, J.E., Andrews, M.P., Li, C.–Y., Najafi, S.I., Makek–Tabrizi, A., "Gratings Fabrication by Ultraviolet Light Imprinting and Embossing in a Sol–Gel Silica Glass," Proc. SPIE–Int. Soc. Opt. Eng., vol. 2695, pp. 52–56 (1996).

Svalgaard, M., Poulsen, C.V., Bjarklev A., Poulsen, O., "Direct UV Writing of Buried Singlemode Channel Waveguides in Ge–Doped Silica Films," Electronic Letters, vol. 30, No. 17, pp. 1401–1403 (1994).

Andrews, M.P., Kanigan T., Najafi, S.I., "Auto–Embossed Bragg Gratings From Self–Organizing Polymers: Chemical Tuning of Periodicity and Photoinduced Anisotrophy," Proc. SPIE–Int. Soc. Opt. Eng., vol. 2695, pp. 4–15 (1996).

Najafi, S. I., Li, C.–Y., Chisham, J., Andrews, M.P., Coudray, P., Malek–Tabrizi, A., Peyghambarian, N., "Ultraviolet Light Imprinted Sol–Gel Silica Glass Channel Waveguides on Silicon," Proc. SPIE–Int. Soc. Opt. Eng., vol. 2695, pp. 38–41 (1996).

Brinker, C.J., Scherer, G.W., "The Physics and Chemistry of Sol–Gel Processing," Sol–Gel Science, Academic Press, Inc. pp. 864–1879.

Li, C.–Y., Chisham, J., Andrews, M., Najafi, S.I., Mackenzie, J.D., Peyghambarian, N., "Sol–Gel Integrated Optical Coupler by Ultraviolet Light Imprinting," Electronic Letters, vol. 31, No. 4, pp. 271–272 (1995).

Andrews, M.P., "An Overview of Sol Gel Guest–Host Materials Chemistry for Optical Devices," Proc. SPIE–Int. Soc. Opt. Eng., vol. 2997, pp. 48–59 (1997).

Rösch, O.S., Bernhard, W., Müller–Fiedler, R., Dannberg, P., Bräuer, A., R. Buestrich, R., Popall, M., "High Performance Low Cost Fabrication Method for Integrated Polymer Optical Devices," Proc. SPIE–Int. Soc. Opt. Eng., Vol. 3799, pp. 214–224.

Roscher, C., Buestrich R., Dannberg, P., Rösch, O., Popall, M., "New Inorganic–Organic Hybrid Polymers for Integrated Optics," Mat. Res. Soc. Symp. Proc. vol. 519, pp. 239–244 (1998).

Mendoza, E.A., "Photolithography of Integrated Optic Devices in Porous Glasses," UMI Dissertation Services (1992).

Mendoza, A., Wolkow, E., Sunil, D., Wong, P., Sokolow, J., Rafailovich, M., den Boer, M., Gafney, H., "A Comparison of Iron Oxides Photodeposited in Porous Vycor Glass and Tetramethoxysilane/Methanol/Water Xerogels," Langmuir, vol. 7, No. 12, pp. 993–4009 (1991).

Che, T., Soskey, P., Banash, M., Caldwell, M., McCallum, I., Mininni, R., Warden V., "Optimization of a Gel Derived Gradient Index Material," Proc. SPIE–Int. Soc. Opt. Eng., vol. 1758, pp. 193–204 (1992).

Gafney, H., "A Photochemical Approach to Integraged Optics," J. Macromol. Sci.–Chem. vol. A27(9–11), pp. 1187–1202 (1990).

Simmons, K., Stegeman, G., Potter, B., Simmons, J., "Photosensitivity of Solgel–Derived Germanoscilicate Planar Waveguides," Optics Letters, vol. 18, No. 1, pp. 25–27 (1993).

Mendoza, E., Gafney, H., "Photolithography of Integrated Optic Devices in Porous Glasses," Nonlinear Optical Materials, CRC Press, eds. Kuhn, H., Robillard, J., Part V, pp. 178–191 (1992).

Mendoza, E., Gafney, H., "Photolithographic Imaging of Planar Optical Waveguides and Integrated Optic Devices Onto Porous Silicate Glasses and Silica Sol–Gels," Mat. Res. Soc. Symp. Proc., vol. 244, pp. 343–350 (1992).

Mendoza, E., Gafney, H., Morse, David, "Photolithographic Processing Of Integrated Optic Devices In Glasses," SPIE vol. 1583 Integrated Optical Circuits, pp. 43–51 (1991).

Mendoza, E., Gafney, H., Morse, D., "The Photochemical Generation of Gradient Indices in Glass," SPIE vol. 1378 Optically Activated Switching, pp. 139–144 (1990).

Wolkow, E., Gafney, H., Wong, P., Hanson, A., "Highly Resolved Gradient Patterns in Glass by Means of Chemical Vapor Deposition," Mat. Res. Soc. Symp. Proc. vol. 168, pp. 381–393 (1990).

Mendoza, E., Ferrell, D., Lieberman, R., "Photolithography of Bragg Gratings in Sol–Gel Derived Fibers," SPIE vol. 2288 Sol–Gel Optics III, pp. 621–629 (1994).

U.S. Appl. No. 09/574,841, filed May 19, 2000, "Thin Film Sol–Gel Derived Glass"; Inventor: Mendoza, Edgar A.

Amendment to U.S. Appl. No. 09/574,840, filed May 19, 2000, "Thermally–Assisted Photolithograpic Process Using Sol–Gel Derived Glass and Products Made Thereby"; Inventors: Mendoza, Edgar A., Kempen, Lothar U., Lierberman, Robert A.

* cited by examiner

INTEGRATED OPTIC DEVICES AND PROCESSES FOR THE FABRICATION OF INTEGRATED OPTIC DEVICES

The present application is a continuation of U.S. Ser. No. 09/823,869, filed Mar. 30, 2001 now abandoned which is a continuation-in-part of U.S. Ser. No. 09/574,840, filed May 19, 2000, and U.S. Ser. No. 09/574,841, filed May 19, 2000, both of which are incorporated by reference as if fully set forth herein.

FIELD OF THE INVENTION

The present inventions relate to the field of integrated optic devices and processes of manufacturing such devices.

BACKGROUND OF THE INVENTION

Modern network structures are typically comprised of a network of networks. Large, geographically dispersed wide area networks (WANs) connect numerous metro area networks (MANs) which in turn connect the local area networks (LANs) originating from residences and businesses. Most network data (non-voice data), originates from LANs and is destined to other LANs. WANs are essentially the highways of modern communications networks, transmitting very large amounts of data traffic at very high speed where that data information is then exited at the MANs and routed to the appropriate address in the appropriate LAN. In order to keep up with the ever increasing bandwidth needs, modern WANs frequently transmit data optically between long distances, or wherever particularly high bandwidth connections are needed, using synchronous optical networking (SONET) rings. SONET rings can be viewed as large rings with nodes distributed at points along the ring. Data traffic, in the form of optical pulses circles the ring along a given fiber. If the data needs to be switched from one fiber to a next, or exited from the ring and routed to its destination, the optical signal must be converted to an electronic signal and then either sent over an electronic network to its destination or reconverted to an optical signal for further transmission on the same or an alternate SONET ring/fiber.

Although today's optical networks, which are primarily confined to the Internet backbone WANs, are actually hybrid opto-electronic networks, it is envisioned that future communications networks will be designed and built from all optical networks extending from LANs all the way to the backbone WANs. In an all optical network, there will be no conversion of optical signals to electronic signals except at the source and destination of the data. All the switching between fibers, routing of data and signal amplification will be accomplished optically. Furthermore, because signal switching, routing and amplification in a communications network is in principal no different than signal switching, routing and amplification in a computer circuit, the same underlying principles and components used in optical networking will ultimately be the basis for optical computers, creating the next great information revolution.

To fully exploit the potential of fiber optic communications, integrated optic components that function at faster transmission rates and higher bandwidths are essential. The low transmission losses, immunity to electrical noise, and huge bandwidth capabilities of optical components are also factors fueling research to develop integrated optic devices—the optical counterpart of integrated electronics. Optical integration and miniaturization also imply increased signal speed, lower optical loss because of reduced optical pathlengths, reduced power requirements, flexibility, ruggedness, compactness, and potential low cost.

Although integrated optics technology is promising, the commercial realization of the promise of integrated optics technology is directly dependent on the establishment of cost effective, reliable techniques of fabricating passive and active waveguiding structures. To date, neither of these requirements has been satisfactorily met. Nor are the current technologies sufficiently flexible.

Optical communications hardware is extraordinarily expensive to build because unlike electronic communications hardware, which is largely implemented with modern integrated circuitry, optical communications equipment is typically comprised of discrete optical components. For example in an electronic multiplexing circuit, the filters, amplifiers and conducting paths are all integrated into a single chip manufactured in one process, but in its optical analog, a wavelength division multiplexer, the analogous filters, amplifiers and waveguides are typically discrete components, individually connected and mostly by hand.

Under currently known technologies, it is even complicated to fabricate channel waveguides—the basic building block structures for integrated optic devices and components—that are suitable for current optical communication applications. For compatibility with optical fibers, channel waveguides are frequently buried in material having a lower index of refraction. This is typically accomplished by first constructing a core layer of a doped $SiO_2$ layer, and then etching the core layer into a rectangular cross-section to form a ridge or strip waveguide. A cladding layer is then used to bury the waveguide cores, as well as to symmetrise the modal fields and isolate them from their surroundings. Thus, waveguides are conventionally fabricated out of glass by multi-step processes involving a combination of lithographic photomask technologies and etching processes. However, the equipment historically used for such etching processes, e.g., reactive ion etchers, has required substantial capital investment.

Technologies available for fabricating the glass layer necessary for producing integrated optics devices currently include: sputtering, thermal oxidation and nitridation, chemical vapor deposition, plasma-enhanced chemical vapor deposition, flame hydrolysis deposition, and sol-gel deposition. The first two technologies are too restrictive, and only the last four are currently under investigation. These different technologies have been discussed in R. R. A. Syms, *Advances in Integrated Optics,* Chapter 7, *Silica-on Silicon Integrated Optics,* pp. 121–150 (1994).

Another problem with the majority of the known technologies is that they involve high temperature processing (>1000° C.), which can be incompatible with constructing a hybrid opto-electronic device on a semiconductor substrate.

While plasma enhanced chemical vapor deposition is a low temperature process, this technology entails complex multistep mask processes including reactive ion etching.

Conventional sol-gel derived glass technologies have required high temperature post-film deposition thermal treatments. In addition, etching and multistep masking have been required to complete the integrated optics device. Further, if sol-gel films greater than about 1 to 2 μm are desired, multiple coating steps with a drying step between each has been required to prevent cracking during consolidation of the film.

One attempt at advancing the sol-gel derived glass technology is described in Canadian Demand Application No. 2,218,273 and U.S. Pat. No. 6,054,253, which are hereby incorporated by reference. These patents describe a process for forming an integrated ridge waveguide on a silicon substrate. The disclosed process includes the steps of producing a film of photosensitive sol-gel on a substrate, applying a photomask having an opening defining the ridge waveguide, exposing the sol-gel film through the photomask to ultraviolet radiation to render the exposed portion insoluble to a given solvent, and wet etching the sol-gel film with a solvent to dissolve the unexposed portion of the sol-gel film and leave the exposed portion of the film, and therefore the ridge waveguide. The ridge waveguide is subjected to a post-baking process at a temperature of less than or equal to 200° C. to further polymerize the remaining sol-gel and drive off moisture. A cladding layer may be added on top of the ridge waveguide to bury it.

Although a step in the right direction, the foregoing process has serious deficiencies. First and foremost, absent resorting to extraordinary measures such as ion implantation, local densification of silica glass by either laser or electron beam irradiation, or multistep deposition, masking, and etch back procedures, it is not possible to vary the index of refraction in the wave guiding portion of the device. Thus, the range of optical devices that may be fabricated is very limited. To make the analogy to electronic circuitry, it would prohibit devices that require the resistance to be varied. Secondly, the etching step tends to also partially etch the sidewalls of the nascent optical device creating tapering and rough edges that result in sidewall scattering, and generally compromise the device's properties as well as the repeatability of the fabrication process. Third, even if a cladding layer is applied in an attempt to planarize the resulting device, as with other topographic waveguide fabrication techniques, it is difficult to achieve a completely planar surface in the final device.

A technique for making planar waveguides without etching is disclosed in Hensch, U.S. Pat. No. 5,080,462. The Hensch method involves local densification of a silica matrix to vary the refractive index of the silica matrix as a function of density. Hensch teaches that integrated optical devices may be formed by densifying a silica sol or monolithic silicon by heating a portion of the silica sol or the monolithic silicon relative to another portion to vary the index of refraction of the one portion relative to the other. Because of the difficulties in controlling the diffusion of heat, Hensch's techniques are not practical for the fabrication of optical devices involving complex geometries, critical feature sizes or areas of highly or tightly varied indices of refraction.

The doctoral thesis *Photolithography of Integrated Optic Devices in Porous Glass*, City University of New York, 1992 by E. Mendoza, one of the applicants herein, describes techniques for fabricating integrated optic devices in bulk porous glass materials. The process includes diffusing an organometallic photosensitizer into a bulk porous glass matrix so that it adsorbs on the surface of the glass, writing the image of an optical device using photolithography, and then fixing the image through two heat treatment steps. The bulk porous glass material primarily investigated in the thesis report is porous Vycor glass (PVG). However, the thesis also states that sol-gel techniques may be used to make the porous glass bulk material.

Although permitting simple devices to be produced that have a highly resolved refractive index gradient between the printed waveguide and surrounding glass, the process and devices disclosed in the thesis suffer from several important drawbacks. Because the photosensitizer is diffused into the porous glass matrix, a concentration gradient exists. This leads to variations in the refractive index of the device in the direction of diffusion. Further, as the porosity of the bulk material is not homogeneous over its entire surface, variations in the amount of photosensitizer that diffuses into the matrix over the surface of the glass material are experienced as well, which in turn leads to unwanted variations in the refractive index in the plane of the device. Because the process is diffusion based, it is also difficult to precisely control the dimensions of the resulting waveguide, particularly in the direction of diffusion.

In E. Mendoza, et al., *Photolithography of Integrated Optic Devices in Sol-Gel Glasses*, SPIE vol. 2288, 580–88 (1994), a process is described for making embedded channel waveguides in a sol-gel film deposited on a glass substrate. According to the described process, a sol-gel was produced using TEOS, ethanol and water in the molar proportions of 1:5:6, respectively. The solution was allowed to hydrolize and polymerize for 12 hours, at which point a photosensitive organometallic compound, dissolved in ethanol, was added to the aged solution. The photosensitized solution was then allowed to mix for 30 minutes, after which a film of the photosensitized sol-gel was formed on a glass substrate by either spinning or dipping. This solution permitted films ranging from 0.25 μm to 2.0 μm to be produced with multiple coatings being required for thicker films in the range. The article also notes that if a binder of polyethylene glycol (PEG) is added to the sol-gel solution during polymerization of the sol, films up to approximately 10 μm in thickness can be produced. However, multiple coatings with intervening drying steps were still required to produce films greater than about 1 μm without cracking. According to the article, these coatings were produced by first coating the glass substrate with the sol-gel solution in a thickness of less than 1 μm, followed by drying the film at 150° C. for 5 minutes. Once the film was dry, additional coatings were applied in the same manner to produce a photosensitized sol-gel film having the desired thickness. Immediately after being coated onto the glass substrate, the photoactive films were exposed to light, followed by a thermal curing treatment at 400° C. for 5 minutes.

While the above approach eliminates issues relating to concentration gradients resulting from diffusion, it is still deficient. First, even with the use of a binder, multiple coatings are required to produce a film of suitable thickness for most optical communication applications (e.g., approximately 6 to 10 μm). Second, the addition of PEG to the glass matrix, weakens the glass significantly because polyethylene is introduced into the glass matrix. Third, the described process simply does not work for a significant number of photosensitizers.

An object of the present inventions is to overcome, or at least ameliorate, one or more of the above-discussed drawbacks. To this end, one aspect of the present invention is directed to providing an improved process for fabricating integrated optic devices. In addition, an improved integrated optic device layer is provided that may be used to fabricate a wide variety of improved integrated optic devices.

SUMMARY OF THE INVENTION

The primary inventions disclosed herein are based on the realization that a thin film of a photosensitive sol-gel glass material that contains a volatile photosensitizer having a photo labile moiety and an inorganic glass modifying constituent can be produced virtually free of lateral shrinkage and without cracking if proper techniques are followed in the preparation and processing of the sol-gel. Consequently a broad range of highly desirable integrated optic components suitable for telecommunication applications, as well as other applications, can be made by such techniques.

Specifically, techniques for the photo exposure and fabrication of integrated optic structures in thin films of photosensitive sol-gel glass materials are described here. These techniques generally involve the formation of a photosensitive sol-gel thin film on a suitable substrate such as glass, silicon, or any other support material. The photosensitive sol-gel material used to form the film preferably includes a photosensitizer having a photo labile moiety and an inorganic glass modifying constituent. The photosensitizer may, for example, be an organometallic photosensitizer. Next, the photosensitive sol-gel film is exposed to light, preferably in the visible or ultraviolet region to induce a photochemical reaction in the photosensitive sol-gel glass network or matrix. The light energy photolyzes the photosensitizer within the exposed portion and irreversibly bonds the photodissociated inorganic glass modifying constituents to the sol-gel glass matrix. A fixing step is then used to remove the unphotolyzed photosensitizer from the glass matrix, as well as the dissociated photo labile moiety. The fixing step is also used to dissociate any organic component that is attached to the bound glass modifier and remove it from the matrix. The end photoproduct is an oxide of the glass modifying constituent, which is preferably a metal oxide, permanently bound to the sol-gel film glass matrix or network as a glass modifier. This in turn induces a permanent refractive index change in the glass. The fixing step may, for example, comprise one or more heat treatments within the range of 80° C. to 1000° C.

The refractive index may be increased or decreased from that of the base sol-gel glass by appropriately selecting the photosensitizer. For example photosensitizers having a glass modifying constituent that is generally smaller than the backbone atoms of the sol-gel glass matrix will tend to result in a decrease in the refractive index. While, on the other hand, photosensitizers having a glass modifying constituent that is larger than the backbone atoms of the of the sol-gel glass matrix will generally tend to increase the refractive index. The amount the refractive index is increased or decreased is dependent on the photosensitizer selected, the base sol-gel mixture, the concentration of the photosensitizer added to the sol-gel mixture, and the amount of photolyzing light energy delivered during the exposure process. Therefore, by spatially varying light intensity during exposure results in a spatially varied refractive index profile. This refractive index profile induced in the photosensitive sol-gel derived glass film can be designed to guide light.

If the sol-gel film is silica based, then a silica glass matrix modified by an oxide of the glass modifier (Si-O-M-O-Si) is formed in the exposed portions. The oxide of the glass modifier in turn modifies the refractive index of the silica glass matrix. Because the unexposed photosensitizer is driven off during the fixing step, the photoinduced device image imprinted in the photosensitive sol-gel film is permanent. Further, as no material is removed from the sol-gel film in this process, as in the case of prior-art topographic methods, the resulting top surface is planar thus leading to simpler processes for producing integrated optic devices and for achieving devices with increased life expectancies.

The index of refraction in each region of the resulting device layer is determined by the concentration of the photoproduced oxide and by the type of oxide (e.g., $GeO_2$, $SnO_2$, $PbO_2$, $TiO_2$, $Fe_2O_3$, among others) produced in each region. Therefore, the change in refractive index in a particular region is determined by the amount of photosensitizer photolyzed in that region, which in turn depends on the amount of photolyzing light energy delivered to the region, and the type of oxide that is photoproduced. As a result, an embedded waveguide, or other optical device, having a higher index of refraction may be readily sandwiched between regions of a device layer having lower refractive index. If the photosensitizer used causes an increase in the refractive index of the resulting sol-gel derived glass matrix upon exposure and fixing, then the waveguide portion of the film would be exposed to more photolyzing light energy so that a greater concentration of the photoproduced oxide dopes the glass a matrix in the region forming the waveguide. On the other hand, if the photosensitizer used causes a decrease in the refractive index of the resulting sol-gel derived glass matrix upon exposure and fixing, then the surrounding region of the film would be exposed to more photolyzing light energy so that a greater concentration of the photoproduced oxide dopes the portion of the glass matrix in the surrounding region then in the waveguide region. Thus, depending on the photosensitizer/sol-gel system used, the photosensitive sol-gel film will be exposed to light energy patterned in either the positive or negative image of the desired optical device.

If the photoproduced oxide exhibits non-linear optical properties (including, for example, semi-conductive, electro-optic, magneto-optic, and/or all optic), active optical devices can be realized. For example, by placing electrodes proximate to a waveguide doped with an electro-optic dopant and applying a voltage, an electro-optic switch or an optical modulator may be formed using a varying electrical field for varying the index of refraction of the waveguide.

The inventions disclosed herein are thus based on the realization that the richness in the number and variety of constituents which can be included in a photosensitive sol-gel film enable unique integrated optic structures to be fabricated, particularly with gray scale photo masks or laser writing techniques, which are not achievable with alternative techniques. Specifically the techniques permit a high degree of control not only in writing an optical device in a photosensitive sol-gel film with a higher index of refraction than the surrounding region, but also in controlling the index of refraction incrementally or continuously along the propagation path of the device. Similarly in multi-channel devices such as wavelength division multiplexers, the index of refraction may be varied from channel to channel of the device. Accordingly, the index can be changed to enable strongly guided waveguides to be fabricated having low-loss, small bend radii, thus permitting a large number of channels to be fabricated in a single film. For example, a two-hundred and fifty-six channel wavelength division multiplexer can be made in a very small chip because the indices of refraction can be tailored channel to channel and along the length of the channel. Moreover, the ends of the channels can be made with indices of refraction to obtain numerical aperture matching to optical fibers.

Furthermore, because the described techniques produce embedded optical devices and because embedded optical devices can be made in successive photosensitive sol-gel films, multiple layer devices can be realized.

The high degree of control of the index of refraction along the length of a channel also permits Bragg gratings to be formed simultaneously with the formation of a channel, thus providing a simple technique for producing, for example, integrated optic lasers. The abundance of compatible optically active dopants, such as erbium, also permits, for example, amplification of light signals in channels.

In one aspect of the invention the process for fabricating an integrated optic device comprises the steps of a.) preparing a photosensitive sol-gel glass material that includes a highly volatile photosensitizer; b.) producing a film of the photosensitive sol-gel on at least a portion of a substrate; c.) imprinting the photosensitive sol-gel film with an image of an optical device by exposing at least a portion of the photosensitive sol-gel film to light energy patterned in the positive or negative image of the device to photolyze photosensitizer within the exposed portion; and d.) fixing the image of the optical device in the exposed sol-gel film to thereby form a planar device layer having an embedded optical device.

Exposure of the photosensitive sol-gel film can be used to photoinduce index of refraction changes in the film of greater than 0.001, or 0.07%, and preferably greater than 0.002, or 0.14%. As a result, a wide variety of optical devices may be readily written into the device layer without having to etch or otherwise dissolve the device layer to first form a topographic device. Furthermore, because a highly volatile photosensitizer is employed in the process, the unphotolyzed photosensitizer remaining in the exposed film may be readily removed in the fixing step without the need of using temperatures above 150° C.

In a second aspect of the present invention a further process for fabricating an integrated optic device is provided. In a first step a photosensitive sol-gel glass material that includes a highly volatile photosensitizer including a photo labile moiety and an inorganic glass modifying constituent is prepared. A film of the photosensitive sol-gel is then produced on at least a portion of a substrate. The photosensitive sol-gel film is then imprinted with an image of an optical device by exposing at least a portion of the photosensitive sol-gel film to photolyzing light energy patterned in the positive or negative image of the device. This photolyzes the photosensitizer within the exposed portion and irreversibly binds the photodissociated glass modifying constituents to the sol-gel glass material. In a basic embodiment of the process the exposed portion comprises one region and the amount of light energy delivered to that region determines the amount of the photosensitizer that is photolyzed within that region. However, in other preferred embodiments, the exposed portion comprises more than one region, with the amount of light energy delivered to each region determining the amount of photosensitizer that is photolyzed in each region. Following the imprinting step, the image of the optical device in the exposed sol-gel film is fixed, thereby forming a planar device layer having an embedded optical device, by heating the exposed sol-gel film to evaporate unphotolyzed photosensitizer remaining in the exposed film and to polymerize the exposed film to form a glass matrix. The glass matrix will be modified in each region of the exposed portion by the inorganic glass modifying constituents photodissociated within that region. Thus, the refractive index of the resulting device layer may be readily and spatially controlled by varying the amount of photolyzing light energy delivered to each region of the exposed portion of the photosensitive sol-gel film.

In yet a further aspect of the present inventions, a process for fabricating an integrated optic device is provided comprising the steps of: a.) preparing a photosensitive sol-gel glass material that includes a volatile photosensitizer; b.) producing a film of the photosensitive sol-gel on at least a portion of a substrate; c.) imprinting the photosensitive sol-gel film with an image of an optical device by exposing at least a portion of the photosensitive sol-gel film to photolyzing light energy patterned in the positive or negative image of the device to photolyze photosensitizer within the exposed portion, wherein the exposed portion comprises at least one region and the amount of light energy delivered to each region within the exposed portion determines the amount of the photosensitizer that is photolyzed within that region; and d.) fixing the image of the optical device in the exposed sol-gel film and thereby forming a planar device layer having an embedded optical device by heating the exposed sol-gel film under a vacuum to evaporate unphotolyzed photosensitizer remaining in the exposed film and to polymerize the exposed sol-gel film to form a glass matrix, the glass matrix being modified in each region of the exposed portion by the inorganic glass modifying constituents photodissociated within that region.

By employing a vacuum to fix the image of the optical device, the foregoing process permits the use of photosensitizers that are not highly volatile (i.e. those having a vapor pressure of less than 20 mm Hg at 25° C.). Heating in a vacuum is desirable for such photosensitizers because they do not fully evaporate from the sol-gel matrix at temperatures less than or equal to 150° C. in commercially viable processing times in the absence of a vacuum. Furthermore, if temperatures greater than approximately 150° C. are employed to remove such photosensitizers, a risk exists of trapping the photosensitizer as well as dissociated components of the photosensitizer in sol-gel derived glass matrix as it collapses, which can lead to undesired defects in the glass matrix. By heating the exposed film in a vacuum, however, less volatile photosensitizers may be removed within a sufficiently short period of time to make the process commercially viable. Furthermore, lower temperatures, preferably of 150° C. or less, can be used in the fixing process to eliminate the risk that the photosensitizer may become trapped in the sol-gel matrix as it begins to collapse.

In still another aspect of the present invention, a process for fabricating an integrated optic device is provided comprising the steps of: a.) forming an optical device on a substrate; b.) forming a cladding layer over the optical device; and c.) forming a protective layer over the cladding layer, wherein the protective layer comprises a moisture barrier layer. The present process is advantageous because it provides an integrated optic device that is resistant to moisture. Because water has absorption peaks in the infrared spectrum, any water absorbed into the optical device or cladding layer will tend to reduce the bandwidth over which the resulting device can be used. The protective layer employed in the present process provides an effective means of preventing moisture from being absorbed into the device or cladding layer, thereby increasing the bandwidth over which the device may be used. Preferably the protective layer is formed from a transparent polymer coating to facilitate fiber alignment with the optical device.

In a further aspect of the invention, an integrated optic device is provided. The integrated optic device comprises a substrate and a planar photosensitive sol-gel derived glass optical device layer disposed on the substrate. The optical device layer includes an embedded optical device, wherein the process of forming the device-layer comprises i.) preparing a photosensitive sol-gel glass material that includes a highly volatile photosensitizer, ii.) producing a film of the photosensitive sol-gel on at least a portion of the substrate, iii.) imprinting the photosensitive sol-gel film with an image of the optical device by exposing at least a portion of the photosensitive sol-gel film to light energy patterned in the positive or negative image of the device to photolyze photosensitizer within the exposed portion, and iv.) fixing the image of the optical device in the exposed sol-gel film.

In yet another aspect of the invention, an integrated optic device is provided comprising a substrate and a photosensitive sol-gel derived glass device layer disposed on the substrate. The device layer comprises an embedded optical device and a surrounding region with different indices of refraction. The Δn between the device and the surrounding region is at least 0.001 and results from different concentrations of a photoproduced oxide being incorporated into the glass matrix of the device layer in the regions forming the device and the surrounding region. Furthermore, the device layer is formed from a photosensitive sol-gel film that is at least 2 μm thick.

In a further aspect of the invention, an integrated optic device is provided comprising a substrate and a photosensitive sol-gel derived glass device layer disposed on the substrate, wherein the device layer comprises an embedded optical device and a surrounding region with different indices of refraction, and the optical device includes a photoinduced continuously graded refractive index region that is graded from a first index value to a second index value.

In another aspect of the invention an integrated optic device is provided comprising a substrate and a photosensitive sol-gel derived glass device layer disposed on the substrate, wherein the device layer comprises an embedded optical device and a surrounding region with different indices of refraction, and the optical device includes a photoinduced quasi-continuously graded refractive index region that is graded from a first index value to a second index value.

In still yet another aspect of the invention, an integrated optic device is provided comprising a substrate and a photosensitive sol-gel derived glass device layer disposed on the substrate, wherein the device layer comprises an embedded optical device and a surrounding region with different indices of refraction, and the optical device comprises a waveguide having different photoinduced indices of refraction along its axis.

In still another aspect of the invention, an integrated optic device is provided comprising a substrate and a photosensitive sol-gel derived glass device layer disposed on the substrate, wherein the device layer comprises a plurality of embedded waveguides, each having an index of refraction greater than the index of refraction of the regions immediately adjacent to the waveguide. Furthermore, the Δn value between each waveguide and its corresponding adjacent regions is different than that of the other waveguides in the plurality.

In an further aspect of the invention, an integrated optic device is provided comprising a substrate and a photosensitive sol-gel derived glass device layer disposed on the substrate, wherein the device layer comprises an embedded tapered waveguide and a surrounding region. The tapered waveguide has a first end and a second end, with the second end being wider than the first end. Furthermore, the waveguide includes a photoinduced refractive index gradient that is graded from a first index value at the first end to a second index value at the second end, where the first index value is greater than the second index value.

Other and further objects, aspects and advantages of the invention will be apparent to those skilled in the art from the description and claims below.

DETAILED DESCRIPTION OF THE INVENTION

The primary inventions disclosed herein are based on the recognition that a photosensitive sol-gel glass material that contains a volatile photosensitizer having a photo labile moiety and an inorganic glass modifying constituent can be readily used to produce a broad range of integrated optic devices having a planar device layer with an embedded optical device by directly imprinting (i.e. writing) the device into a film of the photosensitive sol-gel using light patterned in the image of the device. The primary inventions disclosed herein are further based on the realization that exposure of such a film to patterned light can be used to produce index of refraction changes in the film greater than 0.001, and preferably greater than 0.002, which allows, for example, a waveguide channel of higher index of refraction to be readily sandwiched between regions of lower refractive index. Therefore, one advantage of the methods disclosed herein over topographic methods of fabricating integrated optic devices is that no etching or dissolution of the device layer is required to produce the desired optical structure. Furthermore, because no etching or dissolution step is required to form the device layer, side scattering issues attendant with topographically produced guiding structures are avoided. In addition, smaller device features are possible. Yet, because light, preferably in the range of 150 nm to 700 nm, is used to write the image of the desired optical device into the photosensitive sol-gel film, highly resolved refractive index gradients are possible, allowing fine control over device features. With the selection of appropriate precursors, the photodeposited optical device can be made to exhibit non-linear optical properties (including, for example, semiconductive, electrooptic, magneto-optic, and/or optical gain or amplification). As a result, electrodes placed proximate to the waveguide for creating electric fields in response to applied voltages can induce temporary changes in the refractive index of the device.

Figure 1:
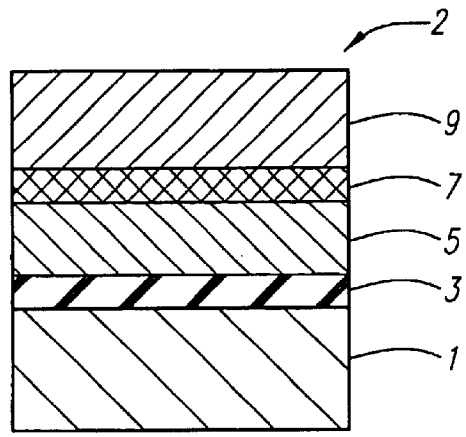
FIG. 1 is a cross-sectional view through a preferred integrated optic device structure according to the present inventions.

In one aspect of the disclosed inventions, processes for fabricating a broad range of integrated optic devices are provided. A preferred multi-layer integrated optic device structure 2 that may be constructed using the processes disclosed herein is illustrated in FIG. 1. Integrated optic device 2 comprises a substrate 1, a buffer layer 3, a device layer 5, a cladding layer 7 and a protective layer 9.

Substrate 1 may be any substrate suitable for use with integrated optics, especially those suitable for telecommunication applications. Preferred substrates include those that comprise semiconductor materials, including, for example, Si, GaAs, InP, GaN on SiC, SiC or $SiO_2$ on Si. Substrate 1 may also comprise, for example, sapphire or glass. Substrate 1 will typically be from about 250 μm to 1 mm thick. A 500 μm thick silicon wafer with a silica layer of about 1 μm to 5 μm grown or deposited on the surface of the wafer is particularly well suited for fabrication of the devices disclosed in the present application. Similarly, $SiO_2$ wafers of about 500 μm thickness are also well suited for fabrication of the devices disclosed herein.

The lateral dimensions of the substrate may vary over a broad range. Preferably, however, a wafer having a diameter of at least 10 cm is used so that a large plurality of devices 2 may be fabricated at one time on a single wafer.

Buffer layer 3 is an optional layer. Typically, however, it will be included in device 2 if the mating surface of substrate 1 has an index of refraction that is greater than, or too close to, the desired index of refraction of the optical device that is to be imprinted into device layer 5. Buffer layer 3 may be formed using any of the techniques known in the art for fabricating buffer layers.

Device layer 5 is a photosensitive sol-gel derived glass layer that includes an embedded optical device and a surrounding region that have different indices of refraction. The Δn between the optical device and the surrounding region is preferably greater than 0.001, or 0.07%, more preferably it is greater than or equal to about 0.002, or 0.14%. The manner in which device layer 5 is fabricated and examples of optical devices that can be embedded in device layer 5 are described in more detail below.

Cladding layer 7 is preferably included in device 2 to bury the optical device embedded in device layer 5, and thereby make the modal fields of light propagating through the optical device symmetric. Cladding layer 7 may be formed using any of the techniques known in the art for fabricating cladding layers. Protective layer 9 is optionally included as a moisture barrier layer. Protective layer 9 is, therefore, preferably made from a hydrophobic material. It is also desirable for protective layer 9 to be lubricious, to help minimize inadvertent damage to device 2 during handling, and transparent, to facilitate fiber alignment with the optical device(s) embedded in device layer 5.

In terms of thickness, buffer layer 3 and cladding layer 7 are typically 2 to 20 μm thick, and are preferably at least 6 μm thick. Device layer 5 is typically 2 to 20 μm thick and is preferably at least 4 μm thick, and more preferably at least 6 μm thick. Protective layer 9 is typically 5 to 100 μm thick and is preferably at least 10 μm thick.

Figure 2:
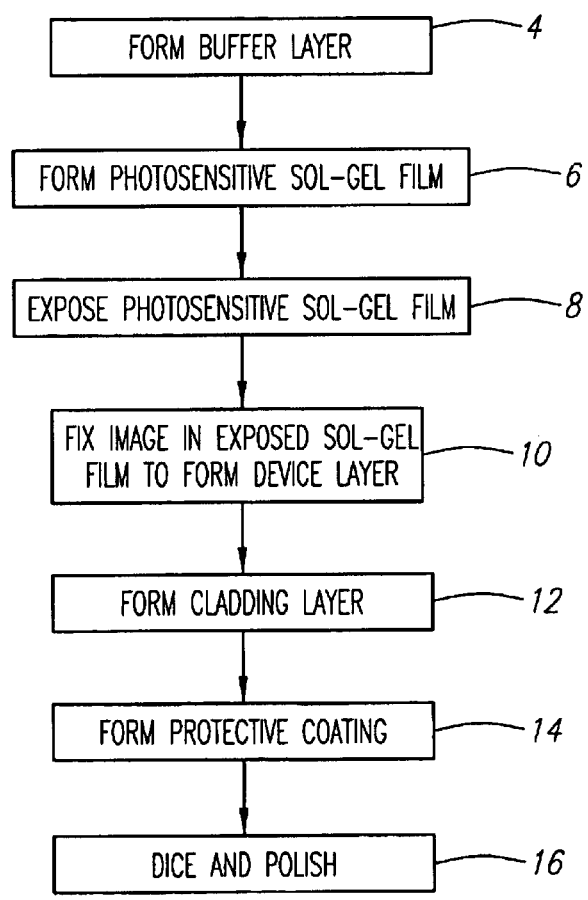
FIG. 2 illustrates one embodiment of a process for forming integrated optic devices according to the present inventions.

FIG. 2 is a schematic diagram illustrating a preferred process for fabricating an integrated optic device 2.

First, in optional step 4, a buffer layer 3 is formed on substrate 1. Next, in steps 6, 8, and 10 device layer 5 is formed. In step 6, a film of a photosensitive sol-gel glass material is formed either on buffer layer 3 or, if the buffer layer is not included in device 2, on substrate 1. The photosensitive sol-gel material includes a volatile photosensitizer that comprises a photo labile moiety and an inorganic glass-modifying constituent. In step 8, the photosensitive sol-gel film is imprinted with an image of an optical device by exposing a portion of the photosensitive sol-gel film to light energy. The light energy photolyzes the photosensitizer within the exposed portion and irreversibly bonds the photodissociated inorganic glass modifying constituents to the sol-gel glass material. Thus, by patterning the light energy in the image of a desired optical device, the optical device may be directly written into the photosensitive sol-gel film. In step 10, the image of the optical device is fixed (or developed) by heating the exposed sol-gel film to drive off unpholyzed photosensitizer remaining in the exposed film and to form a glass matrix in the exposed portion that is modified from that formed in the unexposed portion; the exposed and unexposed portions will, therefore, exhibit different refractive indices. By including sufficient photosensitizer in the photosensitive sol-gel glass material and exposing it to sufficient light energy, the difference in the refractive index between the exposed and unexposed portions can be made greater than 0.001, or 0.07%, and preferably greater than 0.002, or 0.14%. Thus, a planar device layer 5 having an embedded optical device can be fabricated without having to either etch or dissolve the device layer during fabrication (i.e., without having to first produce a topographic waveguide).

In optional step 12, cladding layer 7 is formed on the device layer. In step 14, a protective layer 9 is preferably formed on the cladding layer.

If multiple integrated optic devices 2 are formed on a single wafer substrate 1, then in step 16, the wafer may be diced and polished using standard techniques known in the integrated electronics art to form individual integrated optic devices 2.

Although buffer layer 3 may be formed on substrate 1 using any of the techniques known in the art for forming buffer layers, buffer layer 3 is preferably formed using a sol-gel process. As is known to those skilled in the art of making sol-gel derived glass, the sol-gel process is a low-temperature approach to the production of oxide glasses. An oxide network is obtained via the hydrolization and inorganic polymerization by condensation of molecular precursors. The sol-gel process offers several advantages when compared to production of glasses by other known techniques, including 1) the formation of a higher optical quality metal oxide glass, 2) the ready obtainment of homogeneous multi-component glasses by mixing molecular precursor solutions, 3) the obtainment of higher purity and lower processing temperatures, and 4) the ability to readily produce planar films from spin-coating, dipping, and spraying techniques.

Figure 3:
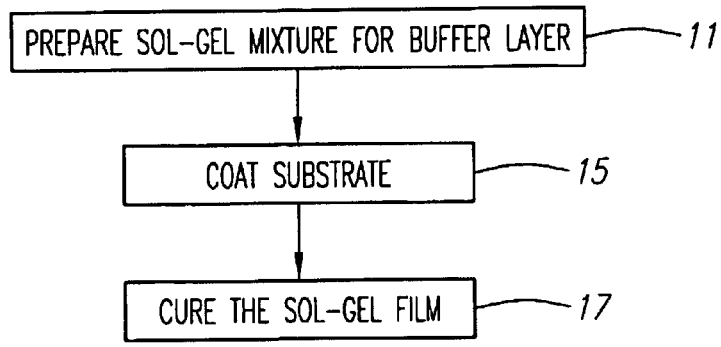
FIG. 3 illustrates a preferred process for forming a buffer layer for an integrated optic device according to the present inventions.

FIG. 3 illustrates a typical sol-gel process for forming buffer layer 3. In step 11, a sol-gel mixture is first prepared. This is typically accomplished by preparing a solution of a metal alkoxide, water, and a mutual solvent such as ethanol, then causing or permitting the solution to undergo a sol-to-gel transition to form a gel through hydrolysis followed by polymerization through condensation. Frequently an inorganic acid or base is added to help catalyze the hydrolysis and polymerization reactions. Common examples of the process for producing silica glass include mixing tetraethylorthosilicate (TEOS) or tetramethylorthosilicate (TMOS), water, and ethanol with a trace amount of an acid catalyst such as HCl acid. Other examples include the use of aluminum t-butoxide ($Al(OBu)_3$) for alumina sol-gels and tetraorthoethyltitanate (TET) or tetrapropylorthotitatanate (TPOT) for titania sol-gels.

Depending on the desired optical properties of buffer layer 3, multicomponent reagents can be mixed into the sol to produce glasses with higher or lower indices of refraction. For example, the refractive index of a sol-gel derived silica glass may be increased by introducing $TiO_2$, derived from the addition of a TET or TPOT precursor, as a dopant, to the original silica based sol-gel mixture.

As those skilled in the art will appreciate, a wide variety of glass modifiers may be used to vary the index of refraction of the sol-gel derived glass. In general, dopants that contain an element that has a larger diameter than the primary metal atoms of the sol-gel derived oxide glass matrix will increase the refractive index of the glass matrix, while those having a smaller diameter will decrease the refractive index of the glass matrix. Thus, for example, a sol-gel derived silica glass matrix doped with $Al_2O_3$, $As_2O_3$, $GeO_2$, $P_2O_5$, $TiO_2$ and $ZrO_2$ will increase the index of refraction of the glass matrix. On the other hand, a sol-gel derived silica glass matrix doped with $B_2O_3$ will decrease the index of refraction of the glass matrix. The amount the index of refraction is increased, or decreased, with a particular dopant will depend in part on the concentration of the dopant included in the sol-gel derived glass matrix.

The foregoing glass modifiers may be readily introduced into the glass matrix by adding precursors, such as metal alkoxides, corresponding to the desired dopant to the sol mixture in a molar concentration necessary to yield the desired index of refraction change.

As described more fully below, preferably the sol-gel used to form the glass buffer layer 3 has the same basic chemistry as the sol-gel used to form the device layer 5, except that a photosensitizer is added to the latter. This is desirable so that the modal fields will be as symmetric as possible following the writing and fixing of the image in the device layer.

The molar concentrations of the reagents used to make the sol-gel mixture and the mixing times of the sol-gel mixture should be selected so as to provide a sol-gel solution having a viscosity suitable for the coating process employed in step 15. Typically a viscosity of approximately 10 to 50 centipoise is suitable for most film coating techniques. More preferably, however, the viscosity of the sol-gel mixture is set in the range of 10 to 30 centipoise to ensure a uniform coating is achieved.

During the preparation step 11, the sol-gel solution is preferably stirred in an air or oxygen atmosphere at room temperature until the solution reaches the desired viscosity. Although the sol-gel solution may be stirred in an inert atmosphere, oxygen increases the rate of the sol-gel reaction. If the polymerization reaction proceeds too quickly, the reaction may be slowed by adding a solvent such as ethanol or lowering the temperature to decrease the rate of evaporation of the alcohol formed from the hydrolysis reaction. Any steps taken that remove the solvent from the sol-gel, for example, spinning, desiccating or heating, will tend to accelerate the polymerization process resulting in a rapid gelation of the film.

After the sol-gel for the buffer layer is prepared in step 11, it is coated onto substrate 1 to form a planar film in step 15. The sol-gel mixture may, for example, be coated onto substrate 1 using spin coating, dip coating or spraying techniques known in the art. Preferably the sol-gel mixture is spin coated due to the high level of uniformity of films resulting from this coating technique.

Preferably, the sol-gel film is spin coated at a speed from approximately 250 rpm to approximately 2000 rpm. Generally, for a given viscosity sol-gel, thicker films are produced at lower speeds, while thinner films are produced at higher speeds. The selected speed, however, should be sufficient to produce a film of uniform thickness.

To improve adhesion of the various layers deposited on substrate 1, as well as the surface smoothness of substrate 1, substrate 1 may be cleaned and polished by chemical and/or mechanical techniques that are well known in the art prior to coating.

In step 17, the sol-gel film forming buffer layer 3 is cured, preferably through a heat treatment process. This may be accomplished, for example, by heating the sol-gel film between 80° C. and 1,000° C. Curing step 17 may comprise a single heat treatment or it may comprise two or more heat treatments. In general, buffer layer 3 should be cured at a temperature and for a time sufficient to finish polymerizing the sol-gel derived glass buffer layer, as well as to remove water formed during the polymerization reaction and alcohol formed from the hydrolysis of the metal alkoxides included in the sol-gel. This can generally take place at temperatures less than or equal to about 200° C., and preferably less than or equal to about 150° C. If it is desired to reduce the porosity of the resulting sol-gel derived glass material, then the buffer layer 3 may be further heat treated at a higher temperature to consolidate the sol-gel derived glass. Typically buffer layer 3 will begin to consolidate when heated to temperatures greater than about 150 to 200° C. However, the higher the temperature achieved during the curing step 17, the greater the bulk density of the buffer layer will be. Consolidation of the glass will also increase the index of refraction of the buffer layer. Thus, the final temperature at which buffer layer 3 is cured is another parameter that may be used to adjust the index of refraction of the buffer layer.

If the sol-gel film forming buffer layer 3 is to be consolidated, the amount buffer layer 3 is to be consolidated should be taken into account when determining the thickness of the original sol-gel layer that needs to be coated onto substrate 1 to achieve a final target buffer layer thickness.

In general, the thicker the sol-gel film that is deposited to produce buffer layer 3, the lower the maximum curing temperature must be in order to avoid cracking of the buffer layer. It is common knowledge in sol-gel art that sol-gel films greater than 2 μm in thickness typically crack during the heat treatment process due to thermal mismatch between the substrate and the sol-gel film. Thus, if the buffer layer 3 is to be greater than about 1 to 2 μm, multiple coating and curing steps 11, 15 may be employed to arrive at a buffer layer 3 of the desired final thickness.

It has been found, however, that a sol-gel derived glass buffer layer 3 that CO is greater than 2 μm, and as thick as at least 10 μm, can be produced from a single film coating step without cracking if an appropriate plasticizer is added to the sol-gel mixture during the preparation step 11 to increase the elasticity of the resulting glass. The employed plasticizer should: 1) bind with the sol-gel matrix; 2) exhibit thermal stability, at least over the temperature range used to remove water and alcohol from the sol-gel glass matrix, and preferably to a temperature range that permits the evaporation of the organic portions of the plasticizer; and 3) provides a stable emulsion so that the water and the metal alkoxide may react. If the plasticizer forms a stable emulsion with water and the metal alkoxide(s) then the solvent may be omitted from the sol-gel mixture. Plasticizers having these characteristics include polysilane derivatives including organotrialkoxysilanes, organotriaminosilanes, and organotrihalosilanes. Organotrialkoxysilanes of the type R-Si-(OR)$_3$ are especially preferred, where R=H, Me, Et, Pr, i-Pr, n-Bu, i-Bu, t-Bu, hexyl, octyl, decyl, dodecyl, vinyl, phenyl, benzyl, chloromethyl, and chloromethylphenyl, with methoxy or ethoxy substituents on the. silicon.

The organotrialkoxysilanes are preferred since they polymerize to produce highly cross-linked network polymers analogous to silica gels.

It is generally preferable to minimize the alkyl content of the OR substituent of the polysilane plasticizer in order to be able to remove through evaporation the hydroxyl compounds produced during the sol-gel hydrolysis reaction at lower curing temperatures (e.g. <200° C.). Similarly, it is also desirable to reduce the alkyl content of the R substituent to minimize the amount of organics in the resulting glass matrix. To generate an even more silica like layer, a polysilane with the R substituent having a very low molecular weight should be chosen so the R substituent can be removed through evaporation from the silica gel matrix by heating, preferably to temperatures of less than about 500° C. As the alkyl content of the R substituent of the plasticizer is increased, however, thicker films may be produced without cracking because the elasticity of the resulting sol-gel derived glass layer increases with increasing organic content.

An example of a preferred sol-gel process for forming buffer layer 3 will now be described. In step 11, a sol-gel mixture was prepared by mixing together approximately 44% by volume of TEOS, approximately 44% by volume of methyltrimethoxysilane (MTMS) as a plasticizer, approximately 10% by volume of water, and approximately 2% by volume HCl acid in a mixing vessel. The mixture was mixed until the viscosity of the sol-gel mixture reached approximately 10 centipoise.

Next, in step 15, a 10 ml aliquot of the solution was applied to the substrate 1. The substrate was then spun at 1000 rpm for 60 seconds or until the film reached a uniform thickness of at least 6 microns. If a thicker film is desired, a larger aliquot may be applied to the substrate and the spin rate and time adjusted until the desired thickness is achieved.

In step 17, the buffer layer 3 was cured by placing the coated substrate on a hot plate heated to 150° C. for five minutes. A second heat treatment at 100° C. for 3 minutes was then employed to finish curing the buffer layer 3. The resulting buffer layer had an index of refraction of 1.41.

Figure 4:
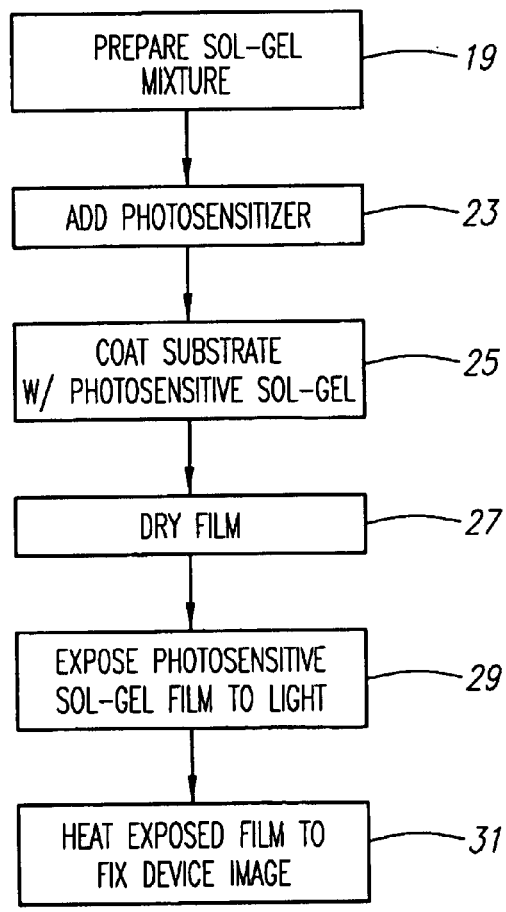
FIG. 4 illustrates a preferred process for forming a device layer for an integrated optic device according to the present inventions.

FIG. 4 shows a preferred method for fabricating the device layer 5.

In an initial step 19, a sol-gel mixture to be employed for the device layer 5 is prepared. As with the preparation of the sol-gel mixture for buffer layer 3 in step 11, this is typically accomplished by preparing a solution of a metal alkoxide, water, and a mutual solvent, such as ethanol, then causing or permitting the solution to undergo a sol-to-gel transition to form a gel through hydrolysis followed by polymerization through condensation. An inorganic acid or base may also be added to the sol-gel mixture to help catalyze the hydrolysis and polymerization reactions.

In general, the particular sol-gel composition prepared in step 19 will depend on the optical properties desired for the unexposed portions of the resulting device layer 5. For example, if the optical device is to be written into device layer 5 in step 29 by exposing the portions of device layer 5 that will form the optical device, then the sol-gel composition selected should be one that will yield a lower refractive index than the optical device. Although not required, in many cases it will be desirable to prepare a base sol-gel mixture in step 19 that has the same basic chemistry as the sol-gel used to form buffer layer 3. This is desirable because it will help make the modal fields to be as symmetric as possible following the writing and fixing of the device image in the device layer 5.

Thus, depending on the desired optical properties of the unexposed portions of device layer 5, multicomponent reagents can be mixed into the sol to produce glasses with higher or lower indexes of refraction. For example, the refractive index of a sol-gel derived silica glass may be increased by introducing $TiO_2$, derived from the addition of a TET or TPOT precursor, as a dopant, to the original silica based sol-gel mixture.

As those skilled in the art will appreciate, a wide variety of glass modifiers may be used to vary the index of refraction of the base sol-gel derived glass. In general, dopants that contain an element that has a larger diameter than the primary metal atoms of the sol-gel derived oxide glass matrix will increase the refractive index of the glass matrix, while those having a smaller diameter will decrease the refractive index of the glass matrix. Thus, for example, a sol-gel derived silica glass matrix doped with $Al_2O_3$, $As_2O_3$, $GeO_2$, $P_2O_5$, $TiO_2$ and $ZrO_2$ will increase the index of refraction of the glass matrix. On the other hand, a sol-gel derived silica glass matrix doped with $B_2O_3$ will decrease the index of refraction of the glass matrix. As one skilled in the art will appreciate the range over which a particular index of refraction of a sol-gel derived glass may be adjusted varies considerably over a wide range as a function of the concentration of the particular dopant/sol-gel system employed.

The foregoing glass modifiers may be readily introduced into the glass matrix by adding precursors, such as metal alkoxides, corresponding to the desired dopant to the sol mixture in a molar concentration necessary to yield the desired index of refraction change. Other methods known in the art for doping a glass matrix with a glass modifier may also be employed. For example, after the device layer is formed, the device layer may be doped by diffusing the dopant into the sol-gel either with or without a mask via chemical vapor deposition. Alternatively, salts of the dopant may also be added to the sol-gel mixture.

In addition to the foregoing dopants, oxides of rare earth metals may be employed as optically active and/or electro/magneto sensitive dopants to further modify the sol-gel derived glass matrix. Oxides of rare earth metals may be introduced into the glass matrix by adding suitable precursors of the rare earth metals to the sol-gel mixture in step 19. For example rare earth alkoxide precursors may be used to introduce rare earth oxides into the sol-gel derived glass device layer. Preferred rare earth alkoxides include among others: erbium ethoxide ($Er(OC_2H_5)_3$), erbium isopropoxide, ($Er(OC_3H_7i)_3$), neodymium ethoxide (Nd $(OC_2H_5)_3$), neodymium isopropoxide, ($Nd(OC_3H_7i)_3$), praseodymium ethoxide ($Pr(OC_2H_5)_3$), praseodymium isopropoxide, ($Pr(OC_3H_7i)_3$), thulium ethoxide (Tm $(OC_2H_5)_3$), thulium isopropoxide, ($Tm(OC_3H_7i)_3$), ytterbium ethoxide ($Yb(OC_2H_5)_3$), ytterbium isopropoxide, (Yb $(OC_3H_7i)_3$), niobium ethoxide ($Nb(OC_2H_5)_5$), and tantalum ethoxide ($Ta(OC_2H_5)_5$). Alternatively, rare earth salts, e.g. chloride and nitrate salts, may also be used to dope the base sol-gel matrix to render it optically active.

Certain rare earth materials are known to form concentration clusters in silica, making it difficult to obtain high concentrations of uniformly dispersed ions in a silica host material. For example, erbium is known to form concentration clusters in a pure silica host, which generally limits the dopant concentration to approximately 100 ppm in $SiO_2$ or $GeO_2$:$SiO_2$. This phenomenon has already been identified as a key difficulty in fiber-based amplifiers, necessitating the use of long fiber lengths (e.g., 90 meters) to achieve the required gain. In an integrated device, the problem is even more acute.

Clustering occurs because the rare-earth oxides (e.g. $Er_2O_3$) are generally insoluble in $SiO_2$. However, it has previously been demonstrated in fiber amplifiers that the use of alumina or phosphorus pentoxide co-doping can drastically reduce the clustering problem in silica. This is because $Er_2O_3$ is soluble in $Al_2O_3$, which in turn is soluble in $SiO_2$. The $Al_2O_3$ forms a salvation shell around the rare earth ion, and the resulting complex is readily incorporated into the silica network. The same principle is presumed to apply with respect to $P_2O_5$ co-doping.

In the process illustrated in FIG. 4, the clustering phenomenon can be readily reduced by selecting appropriate precursors in the sol-gel preparation step. In other words, if one of the foregoing rare-earth dopants is to be added to a silica based sol-gel mixture for purposes of making an optically active device layer, precursors for forming $Al_2O_3$ or $P_2O_5$ co-dopants may be added to the sol-gel mixture prepared in step 19. Alternatively, precursors for any other dopant that acts as a solvation shell for the added rare-earth ion can be used as well.

The molar concentrations of the reagents used to make the sol-gel mixture and the mixing times of the sol-gel mixture should be selected so as to provide a sol-gel solution having a viscosity suitable for the coating process employed in step 25. Typically a viscosity of approximately 10 to 50 centipoise is suitable for most film coating techniques. More preferably, however, the viscosity of the sol-gel mixture is set in the range of 10 to 30 centipoise to ensure a uniform coating is achieved.

During the preparation step 19, the sol-gel solution is preferably stirred in an air or oxygen atmosphere at room temperature until the solution reaches the desired viscosity. Although the sol-gel solution may be stirred in an inert atmosphere, oxygen increases the rate of the sol-gel reaction. If the polymerization reaction proceeds to quickly, the reaction may be slowed by adding a solvent such as ethanol or lowering the temperature to decrease the rate of evaporation of the alcohol formed from the hydrolysis reaction. Any steps taken that remove the solvent from the sol-gel, for example, spinning, desiccating or heating, will tend to accelerate the polymerization process resulting in a rapid gelation of the sol-gel mixture.

After the initial sol-gel mixture for the device layer is prepared in step 19, in step 23 a photosensitive sol-gel glass material is prepared by adding a photosensitizer to the sol-gel mixture from step 19. The added photosensitizer includes a photo labile moiety and an inorganic glass-modifying constituent that photolyze upon exposure to light energy. The photosensitizer is used to induce a refractive index variation in the glass matrix of the device layer 5, which in turn allows the fabrication of waveguide structures capable of guiding light using conventional photolithographic or other light exposure methods. The inorganic constituent of the photosensitizer is transformed into an oxide that acts as a glass modifier, which produces the change in the refractive index, when first exposed to light and then subjected to a heat treatment. Preferred photosensitizer compounds possess the following characteristics: 1)

the photosensitizer is photochemically active when exposed to light, preferably when exposed to light in the UV or visible spectrum; 2) the inorganic constituent of the photosensitizer irreversibly binds to the sol-gel glass matrix when exposed to light; 3) the photosensitizer exhibits thermal stability, at least at the temperature range used to remove unphotolyzed photosensitizer from the sol-gel material; and 4) the photosensitizer compound is volatile, preferably highly volatile.

Photo-activity of the photosensitizer allows the formation of reactive radicals of the inorganic constituent during light exposure. The highly reactive radicals then irreversibly bind to the glass matrix. Thermal stability and volatility are desirable, because a key step in the process is the ability to remove, by evaporation, the unexposed photosensitizer using a heat treatment step.

The amount the index of refraction can be changed from the base index of the sol-gel glass material prepared in step 19 depends not only on the particular photosensitizer added in step 23, but also on the molar concentration of the photosensitizer added to the sol-gel mixture and the amount of light energy delivered during the exposure step discussed below. By including sufficient photosensitizer in the photosensitive sol-gel glass material and exposing it to sufficient light energy, the difference in refractive index between the exposed and unexposed portions can be made greater than 0.001, or 0.07%, and preferably greater than 0.002, or 0.14%. Typically, the concentration of the photosensitizer will range between approximately 2% and approximately 30% by volume of the sol-gel mixture prepared in step 19, and more preferably between approximately 2 and 10%. By employing a photosensitizer concentration within these ranges, it is possible to photoinduce changes in the refractive index of the base sol-gel mixture between approximately 0.001 and 0.35 or higher. In terms of percent difference, it is possible to photoinduce Δn values from 0.07% to 25% or higher.

Once the photosensitizer is added to the sol-gel mixture, the sol-gel mixture is preferably stirred until a homogeneous photosensitive sol-gel mixture is achieved. Stir times of approximately 10 minutes have been found suitable for this purpose. The photosensitizer is preferably added after preparation of the base sol-gel mixture in step 19 to minimize the exposure of the photosensitizer to light, to prevent any predissociation of the photosensitizer due to the acid or intermediate radicals formed during the sol-gel reaction, and to economize the use of an expensive photosensitizes However, it will also be appreciated that steps 19 and 23 may be combined into a single step.

The photosensitizer added in step 23 is preferably an organometallic photosensitizer. Preferred organometallic photosensitizers have the general structure R-M-X, where R is either a branched, unbranched or cyclo-alkyl group of less than 20 carbons, X is a photo-labile moiety and represents a halogen atom, such as chlorine, bromine, iodine, and fluorine, but also includes carbonyls (CO), and M is a metal or semi-metal. The M constituent is preferably a metal selected from the Group IVA, VA, VIA, VIIA, VIIIA, IIB, IIIB, IVB, and VIB metals and the rare earth metals. More preferably M is selected from the group consisting of Ge, Sn, Pb, Se, Te, Fe, Co, Ni, Ti, Zn, Nd, Er, Eu, Pr, and Th. Especially preferred photosensitizers include trimethyl-tin-iodide, cyclopentadienyl titanium dichloride and iron pentacarbonyl. The M constituent may also be a semi-metal selected from the Group IIIB, IVB, VB, and VIB elements, including, for example, B, Si, and P.

Preferred photosensitizers for devices that exhibit optical properties that depend upon the application of applied, electric, magnetic or optical fields (electro/magneto photosensitizers) include compounds where M is selected from the group consisting of Sn, Fe, Nd, Er, Eu, Pr, and Th. An especially preferred electro optical photosensitizer is trimethyl-tin-iodide. An especially preferred magneto optical photosensitizer is iron pentacarbonyl.

Figure 7:
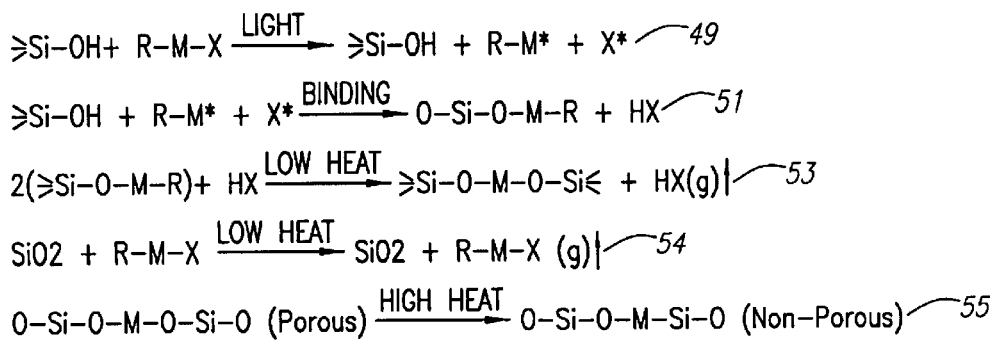
FIG. 7 illustrates the postulated photochemical reaction for a preferred organometallic photosensitizer that allows an optical device to be permanently imprinted in a device layer.

FIG. 7 illustrates a postulated photochemical reaction for the organometallic photosensitizers in a silica based sol-gel glass material. As illustrated in FIG. 7, the photochemical reaction followed by a heat treatment leads to the formation of a photoproduced metal oxide that permits selective modification of the refractive index of the resulting sol-gel derived glass material.

The individual steps that lead to the change in the refractive index of the resulting sol-gel derived glass material are shown in reactions 49 through 55. First, in reaction 49, the organometallic photosensitizer is photodissociated into a reactive metal radical (M*) and a photo-labile halogen radical. In a second reaction 51, the metal radical (M*) reacts rapidly with the abundant silanol (Si-OH) groups in the sol-gel glass material to form an irreversible chemical bond between the metal and the available oxygen in the sol-gel glass matrix. Binding of the metal radical to the oxide glass matrix is a key step in formation of resolved index patterns in sol-gel derived oxide glass films. Concomitantly, volatile HX compounds are formed.

In a third reaction 53, a low temperature heat treatment is used to remove the organic component (R) from the metal, which allows the metal to bind to another silanol group. The end product is a metal oxide glass modifier permanently bound to the silica, or other oxide glass, matrix. Further, the photoproduced metal oxide permanently modifies the index of refraction of the glass matrix. The low temperature heat treatment also drives off the HX compounds and dissociated R component as gas. In actual practice, not only are HX compounds produced but so are $H_2$ gas molecules and $X_2$ gas molecules. In a fourth reaction 54, the same low temperature heat treatment is used to drive off any unphotolyzed photosensitizer, thus fixing the image and leaving behind the base sol-gel derived oxide glass matrix (a silica matrix in the example illustrated in FIG. 7) in the unexposed regions of the photosensitized sol-gol material. In a fifth reaction 55, the porosity of the resulting sol-gel derived glass matrix, as well as the photoproduced metal oxide modified sol-gel derived glass matrix, may be reduced by heating at a high temperature, typically between 200° C. and 1000° C.

Preferably the organometallic photosensitizers that are employed are highly volatile so that all of the unphotolyzed photosensitizer may be readily removed following the image writing step 29 with a low temperature heat treatment in the fixing step 31 discussed below. For purposes of the present application, a photosensitizer is considered highly volatile if it has a vapor pressure greater than or equal to about 20 mm Hg at 25° C. More preferably the photosensitizer has a vapor pressure greater than or equal to about 40 mm Hg at 25° C. It is also desirable for the organometallic photositzer to have a melting point of less than or equal to about 25° C. and a boiling point less than or equal to about 180° C. By setting the vapor pressure of the photosensitizer to greater than or equal to 20 mm Hg, the unphotolyzed photosensitizer can be readily evaporated from the sol-gel material at temperatures of less than 150° C. in a relatively short period of time (e.g., less than 60 minutes). Furthermore, it has also been found that the organic component(s) (R) can be readily removed from the metal radicals that have bonded to the oxide glass matrix during this low temperature heat treatment and evaporated if the photosensitizer is highly volatile. Photosensitizers that are highly volatile typically have an organic component (R) that is a very low molecular weight volatile organic constituent having three or less carbons.

It is desirable for the unphotolyzed photosensitizer and the dissociated organic components (R) to be readily evaporated at temperatures of less than 150° C., because as the fixing temperature increases above approximately 150 to 200° C., the sol-gel derived glass matrix begins to consolidate. Furthermore, as the porosity of the glass matrix is decreased it becomes more difficult to remove the organic compounds from the matrix, which in turn can lead to bubbles or other discontinuities in the glass matrix. This, however, tends to be more of a problem for films that are thicker than 2 μm than those that are less than 2 μm.

Organometallic photosensitizers having a vapor pressure less than 20 mm Hg at 25° C. may also be used if the exposed photosensitive sol-gel is heated during the fixing step in a vacuum system to remove the unphotolyzed photosensitizer, as well as the dissociated organic component(s) (R). Heating in a vacuum is necessary because these photosensitizers will not fully evaporate from the sol-gel matrix at temperatures less than or equal to 150 °C. in processing times that are sufficiently short to make the process commercially viable. Thus, by heating the exposed film to temperatures of 150° C. or less in a vacuum, less volatile photosensitizers may still be removed within a sufficiently short period of time to make the process economical without running the risk of trapping unwanted organic compounds in a collapsed sol-gel derived glass matrix. A vacuum of $10^{-3}$ Torr should typically be sufficient to remove the less volatile organometallic photosensitizers from the sol gel glass material within 1 hour or less when it is heated to 150° C.

It is also possible to employ photosensitizers having a melting point above room temperature. However, the photosensitizer must be dissolvable in the sol-gel mixture.

Returning to FIG. 4, after the photosensitive sol-gel glass mixture for the device layer 5 is prepared in steps 19, 23, it is coated onto buffer layer 3 to form a planar film in step 25. Alternatively, if a buffer layer 3 has not been deposited than the photosensitive sol-gel glass mixture may be coated directly onto substrate 1. The photosensitive sol-gel mixture may, for example, be coated onto substrate 1 using spin coating, dip coating or spraying techniques known in the art. Preferably the photosensitive sol-gel mixture is spin coated. The photosensitive sol-gel film may typically be spin coated at a speed from approximately 250 rpm to approximately 2000 rpm. The selected speed should be sufficient to produce a film of uniform thickness given the viscosity of the photosensitive sol-gel material being spin coated.

Due to the reactivity of the photosensitizer, the coating step 25 is preferably carried out as soon as possible after the photosensitizer is mixed into the sol-gel mixture in step 23, and preferably within 2 hours.

In step 27, the photosensitive sol-gel film formed on substrate 1 is preferably allowed to dry at room temperature, or approximately 25° C., until the film is no longer tacky. Partially drying the photosensitive film is desirable to facilitate subsequent handling during fabrication, especially if a contact photolithography mask is to be used in the exposure step 29. The drying step may be accomplished by storing the coated substrate in a desiccator at room temperature. A drying time of 15 to 60 minutes is typically sufficient. However, if the device image is not to be immediately written into the photosensitive sol-gel film, the coated substrate may be stored in the desiccator, with no exposure to stray light that would photolyze the photosensitizer, for up to about 24 hours without a significant decrease in the activity of the photosensitizer. A red lit room is useful to this end.

As shown in FIG. 4, in step 29 the photosensitive sol-gel film is imprinted with an image of a desired optical device by exposing a portion of the photosensitive sol-gel film to light energy patterned in the image of the desired device. The patterned light photolyzes the photosensitizer within the exposed portion of the photosensitive film. The light energy may be patterned by a simple binary photolithographic mask or a gray scale photolithographic mask. In addition, multiple binary masks and exposures may be used so that different regions of the exposed portion are delivered different amounts of light energy, thereby photolyzing different amounts of photosensitizer in each region.

If photolithography is used to write the image of the device, the photolithographic mask employed may be either a contact or proximity photomask. There are advantages and disadvantages to each. Contact masks provide a sharper lithography image because refraction and other edge effects between the mask and the light are minimized. However, the removal of contact masks may compromise both the film and the mask.

Alternatively, instead of writing the device image by photolithography, the device image may be created by rastering a laser over the surface of the photosensitive sol-gel film in the image of the desired device (i.e., laser writing). Further, by varying the raster rate, different amounts of photosensitizer may be photolyzed within different regions of the exposed portion of the photosensitive sol-gel film.

Light from either a laser or arc lamp is preferably used in the image writing step 29. The light source employed should produce a wavelength of light that is sufficiently energetic to photodissociate the photosensitizer. In order to maximize the quantum yield of the photodissociation process, the wavelength corresponding to the peak of the photodissociation absorption spectrum of the photosensitizer should be used. Once the threshold photodissociation wavelength is determined, any light source producing this wavelength or smaller may be employed. For the photosensitizers disclosed in the application this will generally be light in the visible to UV range.

As noted above, both coherent and incoherent light sources may be employed. Appropriate coherent light sources include, for example, ArF excimer lasers, KrF excimer lasers, frequency multiplied YAG and Nd:YAG lasers, and Ar ion lasers. Suitable incoherent sources include, for example, Xenon flash lamps, mercury discharge lamps or tungsten halide light sources.

The amount of the change in the index of refraction between the exposed and unexposed portions of the device layer will depend on the photosensitizer employed, the base sol-gel mixture, the concentration of the photosensitizer included in the photosensitive sol-gel material, and the amount of light energy delivered to the photosensitive sol-gel material. In general, however, the difference in the index of refraction between the exposed portion and unexposed portion of the device layer may be set as little as 0.001 to as great as 0.35 or more. For weakly guiding waveguides a Δn of about 0.25% is typically desired. Whereas, for strongly guiding waveguides a Δn of 2% or more may be desirable. Furthermore, for a given photosensitizer/sol-gel system the index of refraction may be continuously varied from the maximum that may be induced by complete photolysis of the photosensitizer all the way to no change, based simply on the amount of light energy delivered prior to conducting the fixing step 31.

To determine the appropriate exposure time to generate a particular index of refraction change for a given photosensitizer/sol-gel system, a simple calibration curve may be generated. Alternatively, the extent of the photochemical reaction may be optically assayed by monitoring the disappearance of the characteristic absorption peak of the photosensitizer using an appropriate light detector.

It should be noted that while in most applications photolysis of the photosensitizer will induce an increase in the index of refraction of the sol-gel derived glass, it is also possible to use the photosensitizer to induce decreases in the index of refraction of the base sol-gel matrix. This may, for example, be accomplished by selecting a photosensitizer that has an M constituent with a smaller diameter than that of the primary backbone atoms of the sol-gel derived oxide glass matrix. If photolysis of the photosensitizer induces a decrease in the index of refraction, then a negative of the device image may be used to imprint the device image in the photosensitive sol-gel film during the photolithographic exposure step 29.

In step 31, the imprinted device image is fixed in the exposed sol-gel film to complete the formation of device layer 5. This may be accomplished, for example, by heating the exposed sol-gel film to a temperature between 80° C. and 1000° C. The device layer may be heated by a variety of means including, for example, radiative heating, convective heating, or even microwave heating. Further, the fixing step 31 may comprise a single heat treatment or it may comprise two or more heat treatments. In general, the exposed sol-gel film should be heated at a temperature and for a time sufficient to drive off any unphotolyzed photosensitizer and to dissociate and drive off the organic component (R) from the bound glass modifier, as well as any volatile compounds resulting from the photoreaction. As noted above in connection with FIG. 7, temperatures of less than or equal to about 150° C. are generally suitable for driving off the unphotolyzed photosensitizer, as well as dissociating the organic component (R). However, if the employed photosensitizer has a vapor pressure of less than 20 mm Hg at 25° C., the fixing step is preferably carried out in a vacuum to reduce the time required to remove the unphotolyzed photosensitizer and dissociated organic compounds (R).

The fixing process should also finish polymerizing the sol-gel derived glass device layer, as well as remove water formed during the polymerization reaction and alcohol formed from the hydrolysis of the metal alkoxides included in the sol-gel. As noted above, however, in connection with the description of FIG. 3, heat treatments at less than or equal to 150° C. are also generally suitable for this purpose.

If a photolithographic process employing a contact mask is used to write the image of the optical device into the photosensitive sol-gel film, the mask should be removed prior to fixing the image in the exposed sol-gel film.

If it is desired to reduce the porosity of the resulting sol-gel derived glass device layer 5, then the device layer may be further heat treated at a higher temperature to consolidate the sol-gel derived glass. Typically device layer 3 will begin to consolidate when heated to temperatures greater than about 150 to 200° C. However, the higher the temperature achieved during the fixing step 31, the greater the bulk density of device layer will be. Consolidation of the glass will, therefore, also increase the index of refraction of the device layer, both in the exposed and unexposed portions. Thus, the final temperature at which device layer 3 is heated during the fixing step 31 is another parameter that may be used to adjust the final indices of refraction of the device layer.

As with the buffer layer 3, if the device layer 5 is to be consolidated, the amount device layer 5 is to be consolidated should be taken into account when determining the thickness of the original photosensitive sol-gel layer that needs to be coated on substrate 1 to achieve a final target device layer thickness. Furthermore, as with the buffer layer 3, if a device layer 5 greater than about 1 to 2 µm is required, then multiple coating steps may be employed to arrive at a device layer of the desired final thickness without experiencing cracking of the sol-gel derived film. However, between each coating step, the desired device image must be written into the photosensitive sol-gel film and the image fixed as discussed above in connection with steps 29 and 31. This is not the most desirable approach, however, as registration issues arise with each successive photosensitive sol-gel film deposited on substrate 1. A more desirable approach, therefore, is to add a plasticizer to the photosensitive sol-gel material so that device layers 5 greater than 2 µm, and preferably as thick as at least 10 µm, can be produced in a single film coating step without cracking. Polysilane plasticizers of the type described above in connection with the fabrication of buffer layer 3 have been found to work well without degrading the photosensitizers described herein. Thus, if the device layer 5 is to be greater than 2 µm, a polysilane plasticizer of the type described above is preferably added to the sol-gel mixture in step 19 so that the device layer may be produced in a single coating step. Preferably, the device layer is at least 4 µm, and more preferably it is at least 6 µm, so that the photosensitive sol-gel film coated on the substrate in step 25 is at least 4 µm, and more preferably at least 6 µm.

If a device layer 5 greater than 10 µm is desired, it may still be beneficial to form such device layers using multiple coating, imprinting and fixing steps. However, by employing a polysilane plasticizer in the photosensitive sol-gel, the number of times these steps must be repeated to achieve the desired device layer thickness is reduced because each film comprising the device layer may be made thicker. To minimize the number of coating steps required in such instances, each of the photosensitive sol-gel films formed on the substrate are preferably at least 2 µm thick, and more preferably they are at least 4 µm thick.

Three examples of preferred processes for forming device layer 5 from a photosensitive sol-gel glass material in accordance with the process illustrated in FIG. 4 are now described. Each of the examples was processed as described below. However, the photosensitizer employed in each of the examples was varied as was the light source used to expose the photosensitive film. In addition, various exposure times were used in connection with each photosensitizer.

For each of the examples, in step 19, a sol-gel mixture was prepared by mixing together approximately 44% by volume of TEOS, approximately 44% by volume of MTMS as a plasticizer, approximately 10% by volume of water, and approximately 2% by volume of HCl acid in a mixing vessel. The mixture was stirred until the viscosity W of the base sol-gel mixture was approximately 15 centipoise.

Next, in step 23, an organometallic photosensitizer having the general formula R-M-X was added to the sol-gel mixture from step 19 in a concentration of 5% by volume. The photosensitizer was then mixed with the sol-gel glass mixture for 10 minutes to form a photosensitive sol-gel mixture.

In step 25, a 10 ml aliquot of the photosensitive sol-gel glass material was applied on top of a buffer layer 3 previously formed on the substrate. The substrate was then spun at 1000 rpm for 60 seconds or until the film reached a thickness of at least 8 µm. If a thicker film is desired, a larger aliquot may be applied to the substrate and the spin rate and time adjusted until the desired thickness is achieved.

In step 27, the substrate with the coated photosensitive film was permitted to dry at 25° C. in a desiccator until it was no longer tacky. Then in step 29, the dried photosensitive sol-gel film was exposed through a binary photolithography contact mask to light energy from an appropriate light source for the added photosensitizer. Finally, in step 31, the imprinted image was fixed by placing the coated substrate on a hot plate heated to 150° C. and heating the exposed photosensitive sol-gel film for five minutes. A second heat treatment at 100° C. for 3 minutes was then employed to finish fixing the image in the device layer, as well as cure the glass matrix forming the device layer.

Depending upon the photosensitizer employed and the time of exposure, the index of refraction between the exposed and unexposed portions of the device layer varied.

In the first example, 5% by weight of trimethyltiniodide was added to the sol-gel mixture in step 23. In step 29 the photosensitive film was exposed to 20 mW/cm$^2$ of radiation having a wavelength of approximately 254 nm, which, for example, could be from a mercury discharge lamp, a frequency quadrupled YAG laser or a KrF excimer laser. The index of refraction of the resulting doped sol-gel varied from 1.55 when exposed for 8 hours down to 1.43 when exposed to 1 hour, and 1.41 for unexposed portions. Thus, Δn between the exposed and unexposed regions varied from 0.14 (or 9.93%) for 8 hours exposure to 0.02 (or 1.42%) for 1 hour exposure. When trimethyltiniodide is used as a photosensitizer, the resulting sol-gel matrix modifier is $SnO_2$.

In a second example, 5% by volume of cyclopentadienyl titanium dichloride was added to the sol-gel mixture in step 23. In step 29, the photosensitive film was exposed to 20 mW/cm$^2$ of either 514 nm or 535 nm radiation from either an Ar ion laser or a frequency doubled Nd:YAG laser. The index of refraction of the resulting doped sol-gel varied from 1.70 when exposed for 8 hours down to 1.45 when exposed for 1 hour, and 1.41 for unexposed portions. Thus, an between the exposed and unexposed regions varied from 0.29 (or 20.6%) for 8 hours exposure to 0.04 (or 2.84%) for 1 hour exposure. When cyclopentadienyl titanium dichloride is used as a photosensitizer, the resulting sol-gel matrix modifier is $TiO_2$.

In a third example, 5% by volume of ironpentacarbonyl was added to the sol-gel mixture in step 23. In step 29, the photosensitive sol-gel film was exposed to 20 mW/cm$^2$ of approximately 355 nm radiation, which, for example, could be from either a mercury discharge lamp, a xenon flashlamp or a frequency tripled YAG laser. The index of refraction of the resulting doped sol-gel varied from 1.55 when exposed for 8 hours down to 1.43 when exposed for 1 hour, and 1.41 for unexposed portions. Thus, Δn between the exposed and unexposed regions varied from 0.14 (or 9.93%) for 8 hours exposure to 0.02 (or 1.42%) for 1 hour exposure. When ironpentacarbonyl is used as photosensitizer, the resulting sol-gel matrix modifier is $Fe_2O_3$.

Because each photosensitizer tends to have a unique absorption peak, another unique aspect of the present invention is that multiple photosensitizers may be added to the same sol-gel mixture in step 23. The photosensitive sol-gel film may then be exposed with the appropriate light sources to photolyze each of the photosensitizers without significantly causing the other photosensitizer to photolyze. Depending on the optical device to be written in device layer 5, the exposed regions may be entirely separate or they may overlap.

Figure 8:
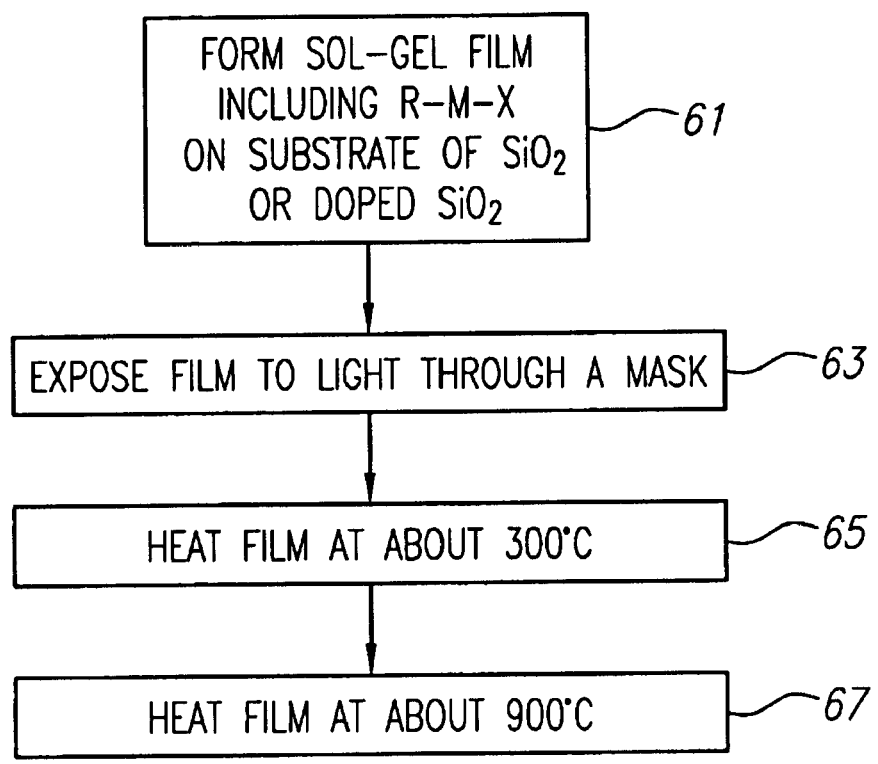
FIG. 8 illustrates an alternative embodiment of a process for fabricating integrated optic devices according to the present inventions.

An alternative preferred process for forming a device layer 5 less than 1 µm is shown in FIG. 8. In a first step 61, a photosensitized sol-gel film of less than 1 µm is formed on a suitable substrate such as silica glass or silicon containing a thermally grown silica layer. Alternatively, as described above, the photosensitized sol-gel film may be formed on a buffer layer, which is in turn formed on the substrate. Because the instant sol-gel films are so thin, namely less than 1 µm, a plasticizer need not be employed. Otherwise, however, the photosensitive sol-gel mixture may be prepared in accordance with the description of steps 19 and 23 of FIG. 4 above.

In a second step 63, at least one channel is photolithographically imprinted in the sol-gel layer with an appropriate wavelength of light. As discussed above, the light causes a photodissociation reaction that upon a subsequent curing step creates a photoproduced metal oxide modified glass matrix. As was also discussed above the light may range from the visible (400–700 nm) to the UV (150–400 nm) with the only limitation on the wavelength being that it must be sufficient to photolyze the employed photosensitizer and be smaller than the device feature sizes sought. There is also no inherent limitation on the exposure time. Thus, depending upon the intensity of the incident light, the exposure time may vary, for example, from 5 minutes to 48 hours.

In steps 65 and 67 the exposed sol-gel film is cured. In step 65, the photoexposed sol-gel film is heated to approximately 300° C. to drive off any unexposed photosensitizer, as well as evaporate the organic component (R) from the film. In step 67, the exposed sol-gel film is further heated to 900° C. to further consolidate the film and finish curing it.

Because the device layer is less than 1 µm, substantially higher curing temperatures may be employed without concern of cracking the film. Indeed, temperatures as high as 1050° C. may safely be used to consolidate the glass matrix when films of less than 1 µm are deposited. Furthermore, although the device layer will begin to consolidate in the initial heat treatment step, because the produced film is so thin, the risk of entrapped organic compounds is minimized.

If a device layer greater than 1 µm is desired, the process illustrated in FIG. 8 may still be employed. However, steps 61 through 67 must be repeated multiple times to until the final thickness of the desired device layer is achieved. Thus, the device layer may comprise a plurality of 1 µm film coatings that have each been consecutively exposed and cured.

Figure 5:
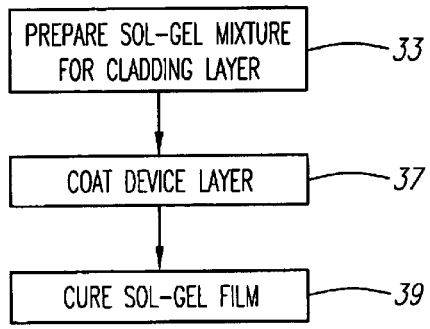
FIG. 5 illustrates a preferred process for forming a cladding layer for an integrated optic device according to the present inventions.

Although cladding layer 3 may be formed using any of the techniques known in the art for forming cladding layers, cladding layer 7 is preferably formed using a sol-gel process. FIG. 5 schematically illustrates a preferred sol-gel process for forming the cladding layer.

First, in step 33, a sol-gel mixture is prepared. This may be accomplished in the same manner as described in connection with step 11 of FIG. 3 for preparation of the sol-gel mixture for the buffer layer. Indeed, it is desirable to use the same sol-gel mixture for the cladding layer 7 as for the buffer layer 3 so as to make the modal fields of the light propagating through the optical device embedded in device layer 5 as symmetric as possible. Once the sol-gel mixture is prepared, in step 37 a film of the sol-gel mixture is formed on the device layer using any of the standard coating techniques, such as dip coating, spin coating or spraying.

Preferably, the cladding layer is spin coated in a single coating step as described above in connection with the buffer layer. Typically the cladding layer will range between 2 and 20 µm, and is preferably at least 6 µm thick.

After the sol-gel film forming the cladding layer is coated onto the device layer 5, it is cured in step 17. In general, the cladding layer may be cured in the same manner described above in connection with step 17 in FIG. 3 for the buffer layer.

An example of a preferred process for forming cladding layer 7 will now be described. In step 33, a sol-gel mixture was prepared by mixing approximately 44% by volume of TEOS, approximately 44% by volume of MTMS as a plasticizer, approximately 10% by volume of water, and approximately 2% by volume of HCl acid. The mixture was mixed until the viscosity of the sol-gel mixture reached approximately 10 centipoise.

Next in step 37, a 10 ml aliquot of the sol-gel solution was applied to the device layer 5. The substrate was then spun at a 1000 rpm for 60 seconds or until the cladding layer reached a uniform thickness of approximately 6 µm. If a thicker or thinner film is desired, the volume of the aliquot and spin rate may be adjusted accordingly. In step 39, the cladding layer was cured by placing the coated substrate on a hot plate heated to 150° C. for five minutes, followed by a second heat treatment at 100° C. for three minutes. A third heat treatment at 85° C. for two minutes was then employed to finish curing the cladding layer 7.

As noted above, protective layer 9 is optionally included as a moisture barrier layer. Protective layer 9 is, therefore, preferably made from a material that provides a suitable barrier to water so as to prevent device deterioration due to the adsorption of water. It is also desirable to employ materials for protective layer 9 that are transparent to facilitate fiber alignment with the inputs and outputs of the optical device(s) embedded in device layer 5. Additionally, it is also desirable to employ materials exhibiting a low coefficient of friction to help minimize inadvertent damage to device 2 during handling.

A number of polymer coatings may be employed for protective layer 9. Furthermore, the polymer coating may be formed on the cladding layer 7, or directly on device layer 5 if the cladding layer is omitted, using any of the known techniques for forming polymer coatings, including dipping, spraying, and physical vapor deposition techniques. Preferably, however, protective layer 9 is formed from a solution based polymer and spin coated. Suitable solution based polymers, include, for example, polymethylmethacrylate (PMMA), polyvinylacrylate (PVA), polyvinylchloride (PVC), polytetrafluoroethylene (TEFLON®), and 4,5-difluoro-2,2-bis(trifluoromethyl)-1,3-dioxole polymer with tetrafluoroethylene (TEFLON AF®).

In addition to polymer coatings, metal films may also be used as protective layer 9. Suitable metal films may be formed using well-known chemical vapor deposition and physical vapor deposition techniques.

Figure 6:
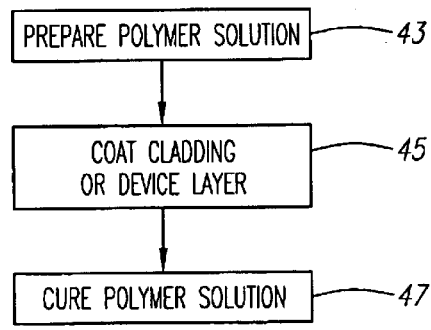
FIG. 6 illustrates a preferred process for forming a protective layer for an integrated optic device according to the present inventions.

FIG. 6 shows a typical process for forming a polymeric protective layer 9 using a solution based polymer system. In step 43, a solution of the desired polymer is prepared by, for example, mixing an appropriate precursor for the desired polymer with an appropriate organic solvent until its viscosity is suitable for the coating process to be employed in step 45. In some preparation steps a catalyst will be added to catalyze the polymerization reaction. The prepared polymer solution is then coated onto the surface of the cladding layer, or the device layer in the absence of a cladding layer. Suitable coating methods include, spin coating, dip coating, spray coating, pouring, or brushing. Once the polymer coating has been applied, it is then cured in step 47. The curing method employed will typically depend on the particular polymer coated. However, typical curing methods include, for example, heating, exposure to UV or visible light, or simply allowing the coating to set.

A preferred process for forming a TEFLON AF® coating is now described. First, in step 43 a TEFLON AF® solution supplied by E.l. du Pont de Numours and Company is diluted to approximately 1–10% by volume with a suitable solvent. The mixture is then mixed until uniform consistency is achieved. In step 45, a 10 ml aliquot of the solution is applied to the cladding layer 7 and spun at 1200 rpm for 30 seconds or until the protective layer reaches a preferred thickness of at least 10 micrometers thick. If a thicker protective layer is desired for a device, a more concentrated solution may be applied to the cladding layer or the spin rate may be decreased. The protective layer is then cured in step 47 by heating the coating between 80 and 200° C. to drive off the solvent and form a solid TEFLON AF® polymer layer.

As noted above, if multiple integrated optic devices 2 are formed on a single substrate 1, then as shown in step 16 of FIG. 2, upon completion of the formation of the various layers, the substrate may be diced and polished using techniques known in the art to produce individual integrated optic devices 2. The individual optic devices 2 are finally packaged by coupling fibers to the inputs and outputs of the embedded optical device in device layer 5 using techniques known in the art. If a silicon substrate is used, this is preferably accomplished by pig-tailing the fibers using a V-groove fiber alignment feature in the silicon substrate as is known in the art. The individual optic devices 2 may also be packaged in a thermally stable hermetically sealed package using known techniques.

Devices

The foregoing described processes permit a wide range of passive devices to be fabricated, including, for example, channel waveguides, optical couplers, splitters, switches, filters, combiners, fiber spacing concentrators, arrayed waveguide gratings, beam expanders, beam concentrators, directional couplers, interferometers, optical add-drops, and diffraction gratings. These and other passive devices may be readily fabricated using the foregoing processes because they enable the index of refraction to be selectively varied throughout the plane of the device layer. Furthermore, because no etching or dissolution step is required to produce the embedded optical devices, side scattering attendant with topographically produced devices is significantly reduced.

In addition to passive devices, active devices can also be easily fabricated by doping all or part of the device layer with an electro-active or magneto-active dopant. The application of an electric or magnetic field across the device layer can then be used to cause the index of refraction to vary with the strength and dimensions of the applied field. The temporary change in refractive index can, for example, be used to switch or modulate light guided through a waveguide. In a similar fashion part, or all, of the device layer may be doped with a dopant that permits the index of refraction to be varied as a function of an applied optical field. Thus, permitting switches and active devices based upon the modulation of a light source to be fabricated. A full range of the types of optical devices that may be fabricated according to the methods of this invention may be found, for example, in *Optical Fiber Communications* 111B, *Academic Press*, New York edited by Ivan P. Kaminow and Thomas L. Koch, 1997.

Illustrative examples of various passive and active integrated optic devices that may be fabricated using the above-described processes are now described.

Figure 9:
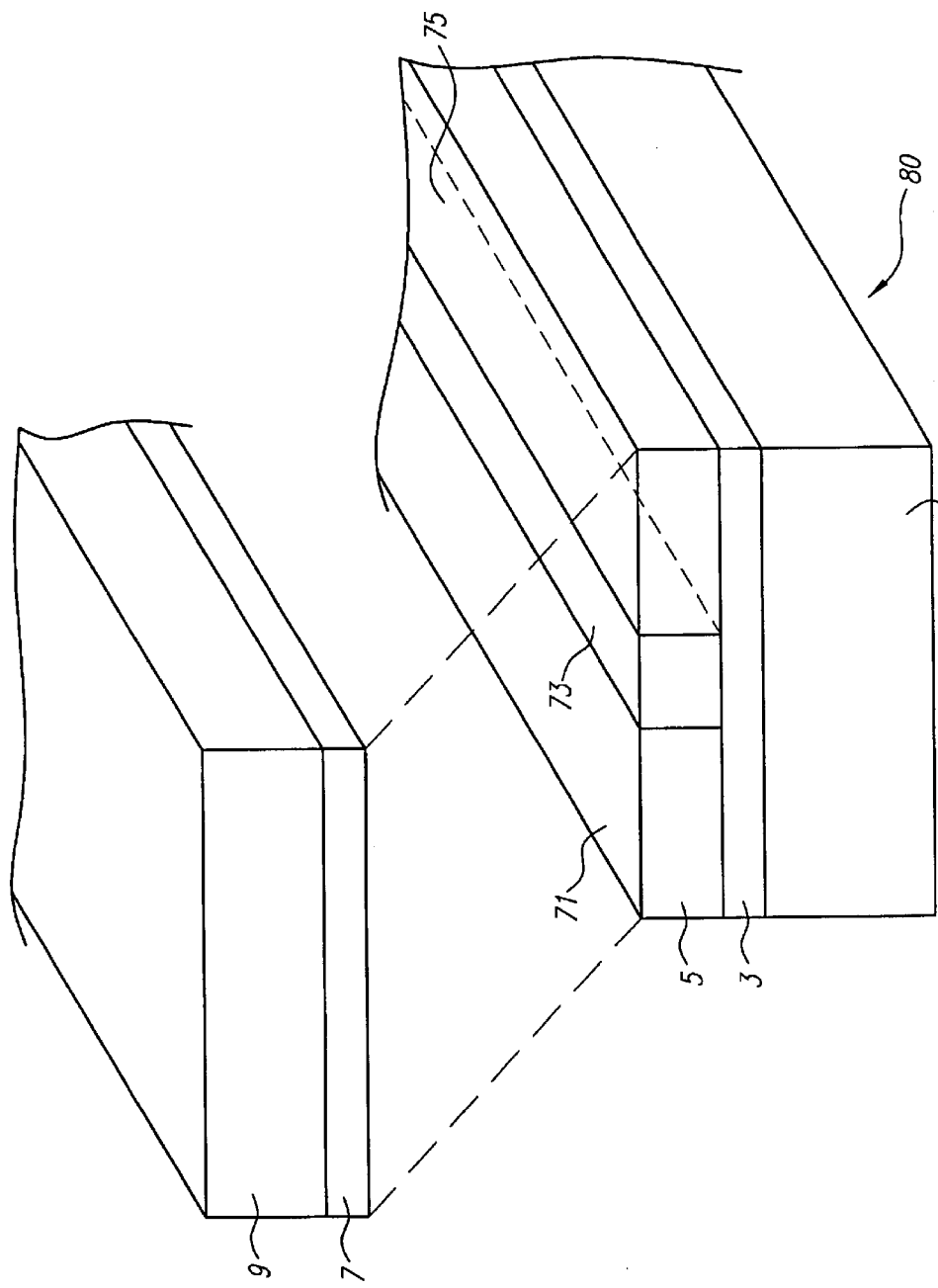
FIG. 9 is an exploded partial perspective view of a preferred channel waveguide structure according to the present inventions.

FIG. 9 shows an exploded partial perspective view of planar integrated optic device 80 that includes a basic channel waveguide 73. Integrated optic device 80 comprises: 1) a planar substrate 1 characterized by an index of refraction n(s); 2) a planar sol-gel derived buffer layer 3 characterized by an index of refraction n(b); 3) a planar photosensitive sol-gel derived device layer 5 characterized by regions 71, 73 and 75 with indices of refraction n(wg,I), n(wg,II) and n(wg,III), respectively; 4) a planar sol-gel derived cladding layer 7 characterized by an index of refraction of n(c); and 5) a planar polymer protective layer 9.

Although in principle each layer's thickness is only limited by the techniques for applying lamellar sol-gel and polymer films, it is preferable that the buffer layer 3 be at least 6 microns thick, the device layer 5 be at least 8 microns thick, the cladding layer 7 be at least 6 microns thick, and the protective layer 9 be at least 10 microns thick.

Substrate 1 may comprise any of the substrates described above. Preferably, however, substrate 1 comprises a silicon wafer, a silicon wafer with a silica layer grown or deposited thereon, or a silica wafer.

It is well understood in the art that in order for a waveguide to guide light, the index of refraction of the light guide must be higher than the surrounding material. Accordingly, the indices of refraction are set as follows: n(wg,II) >n(c), n(b) and n(wg,II) >n(wg,I), n(wg,II). The index of refraction for surrounding region 71, n(wg,I), in device layer 5 preferably equals the index of refraction for surrounding region 75, n(wg,III). The index of refraction for the surrounding regions 71, 75 in device layer 5 also preferably equals the index of refraction for the buffer layer and the cladding layer so that the modal field of light propagating through channel waveguide 73 will be as symmetric as possible. However, as one skilled in the art will appreciate, this is not necessary provided that the conditions n(wg,II)>n(c), n(b), n(wg,I), and n(wg,III) are satisfied.

The Δn between the waveguide 73 and the surrounding regions 71, 75, as well as buffer layer 3 and cladding layer 7, is preferably at least 0.001, and more preferably at least 0.002. In terms of percent difference, Δn is preferably at least 0.07%, and more preferably at least 0.14%. However, as noted above, the photoinduced refractive index change in waveguide 73 can be 0.35 or higher, which means that for certain sol-gel derived glasses a Δn value of at least 25% can be achieved. The actual change in the index of refraction will depend on the composition of the base sol-gel glass mixture, the photosensitizer added to the base sol-gel mixture glass mixture, and the amount of light energy delivered during the exposure or device writing step.

Figure 10:
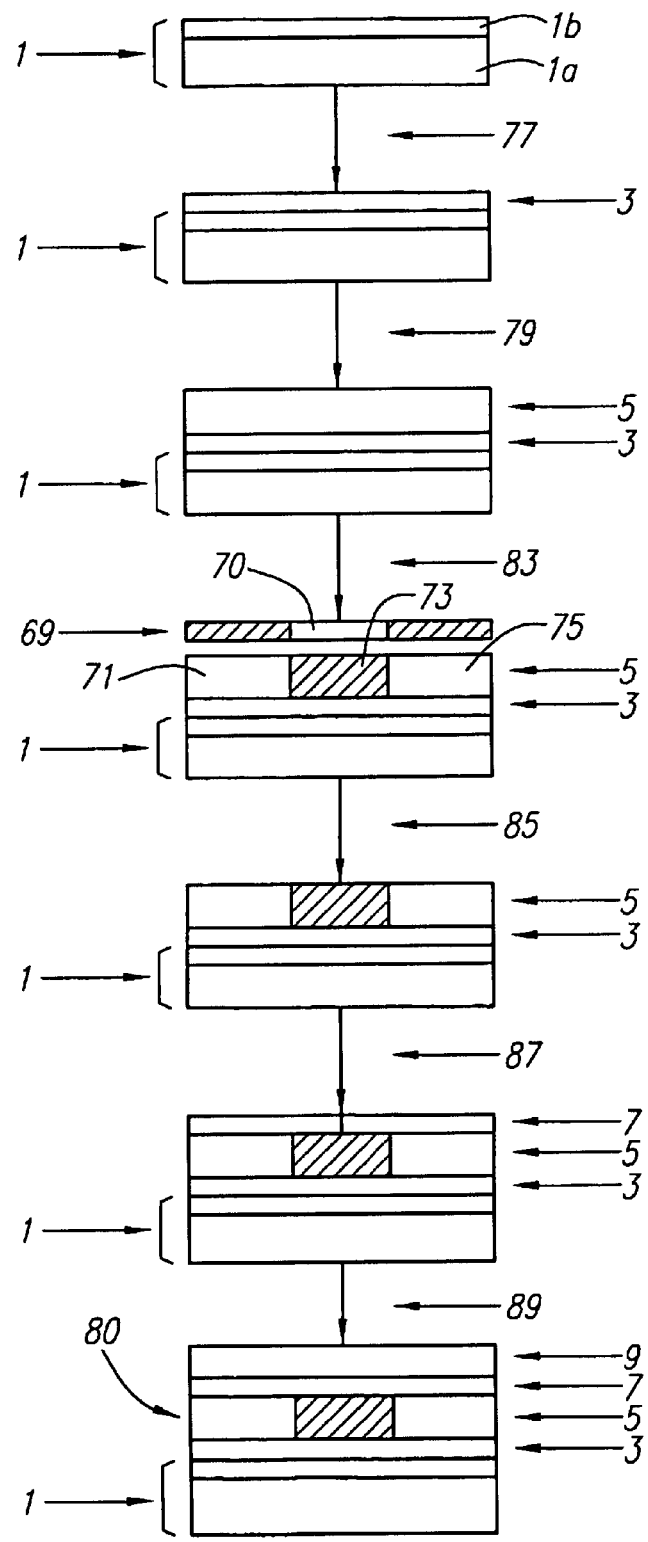
FIG. 10 schematically illustrates a process for forming a channel waveguide device according to the present inventions.

FIG. 10 schematically illustrates a preferred method of fabricating the integrated optic device 80 shown in FIG. 9. Initially a substrate 1 may be cleaned using standard techniques in the industry. The illustrated substrate 1 comprises a silicon wafer 1a with a silica layer 1b deposited or grown thereon. However, as noted above, other substrates may also be used.

In step 77, a 6 μm thick sol-gel derived buffer layer 3 is formed on substrate 1. Buffer layer 3 may be formed as described in connection with FIG. 3 above. Preferably the sol-gel material used to form buffer layer 3 includes a polysilane plasticizer so that buffer layer 3 may be formed using a single spin coating step. In step 79, an 8 μm thick film of a photosensitive sol-gel glass material that includes an organometallic photosensitizer is formed on the cladding layer 3 for purposes of forming device layer 5. Preferably the photosensitive sol-gel material used to form the photosensitive sol-gel film is prepared in accordance with steps 19, 23 of FIG. 4. Furthermore, a polysilane plasticizer is preferably included in the photosensitive sol-gel material during its preparation so that the device layer may be formed using a single spin coating step.

In step 83, the photosensitive sol-gel material forming device layer 5 is masked with a simple binary photolithography mask 69 having a channel 70 formed therein that is aligned with location where waveguide 73 is to be imprinted. The masked photosensitive sol-gel film is then exposed to photolyzing light energy within the ultraviolet or visible spectrum. Preferably the light energy is generated from either a laser or an arc lamp. Light passing through channel 70 in mask 69 photolyzes the photosensitizer within region 73 of the photosensitive sol-gel film into a reactive metal radical (M*) and a photo labile moiety. The reactive metal radical (M*) then rapidly and irreversibly bonds with the available oxygen in the sol-gel glass matrix as described above in connection with FIG. 7.

In step 85, the photolithographic mask is removed and the image is fixed in device layer 5 by heating the exposed sol-gel film at approximately 150° C. for 5 minutes and then heating at approximately 100° C. for 3 minutes. As discussed above, this cures the image by driving off any unphotolyzed photosensitizer and the organic component (R) from the bound metal atoms, which in turn results in a photoproduced metal oxide modified sol-gel glass matrix within the exposed region 73. The photoproduced metal oxides are permanently bound to the oxide glass matrix and thereby permanently modify its index of refraction in region 73. The curing step also marks the completion of device layer 5.

Because the amount of light energy delivered to the exposed region 73 controls the percentage of photsensitizer that is photolyzed within the exposed region, the concentration of the photoproduced metal oxide within the exposed region, and thus the refractive index of the exposed region, can be readily controlled.

If the refractive indices of surrounding regions 71, 75 are to be equal to the index of the buffer layer 3, then the sol-gel material prepared in accordance with step 19 of FIG. 4 (i.e., the base sol-gel mixture without the photosensitizer added) should have the same composition as the sol-gel mixture that is used to form buffer layer 3. If these regions are not exposed to photolyzing light energy during the device writing step, then none of the photosensitizer will be photolyzed in these regions. Thus, during the fixing step, the unphotolyzed photosensitizer will be evaporated from these regions and the resulting glass matrix will be the same as that for the buffer layer, assuming the curing and fixing heat treatments are the same for the buffer layer and device layer, respectively.

In steps 87 and 89, a 6 μm thick sol-gel derived cladding layer 7 and a 10 μm thick protective layer 9 are respectively formed on the top of the sol-gel waveguide layer 5. Cladding layer 7 may be formed in the manner described in connection with FIG. 5 above. Preferably cladding layer 7 is formed in a single coating step and from a sol-gel mixture having the same composition as that used to form buffer layer 3. Protective layer 9 may be any of the protective layers described above. Preferably, however, protective layer 9 is a polymer coating.

Because, as shown in FIG. 10, the photolithography mask 69 is a binary mask, the indices of refraction in regions 71, 75 will be equal. However if a grayscale mask were used the index of refraction of region 71 can be made to be different from the index of refraction in region 75. The same result may also be achieved by employing multiple exposure steps with different binary masks for each exposure step. A laser writing process may also be employed to imprint the image of optical device 73 in device layer 5.

The ability to precisely control the width of the channel waveguide in the x-direction and thickness of the film in the y-direction permits the number of modes in the x and y directions to be tightly controlled. As illustrated in FIGS. 9 and 10, the processes disclosed herein also permit highly resolved refractive index gradients to be produced between an optical device, such as waveguide 73, and the surrounding regions 71, 75 in a planar device layer without the need of employing an etch and refill approach of the topographic devices. This significantly simplifies the process of fabricating integrated optic devices. Furthermore, because the photosensitizer is mixed with the sol-gel prior to coating, the photo-induced index of refraction within the exposed portion 73 is substantially uniform throughout the thickness of device layer 5.

The present invention's ability to precisely control the index of refraction throughout the device layer during the light exposure step also permits the fabrication of channel waveguide structures with complex index profiles along the light propagation path, as well as nonlinear geometries. The devices described below, all of which can be readily fabricated using the processes disclosed herein, will help to further illustrate these points. Although for many of the described devices only a schematic representation of a top view of the device is provided, it is to be understood that each of these described optical devices is actually formed in a device layer 5, which is in turn formed on a substrate 1. It should also be understood that the actual structure of the integrated optic device may further include a cladding layer 3, a buffer layer 7, and/or a protective layer 9 as illustrated in the preferred integrated optic device structure shown and described in connection with FIG. 1.

Figure 11:
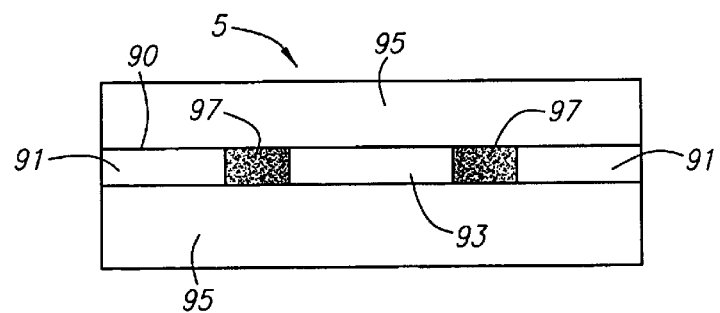
FIG. 11 illustrates a preferred channel waveguide device with regions of high and low indices of refraction connected by regions of continuously graded indices of refraction that may be fabricated according to the present inventions.
Figure 12:
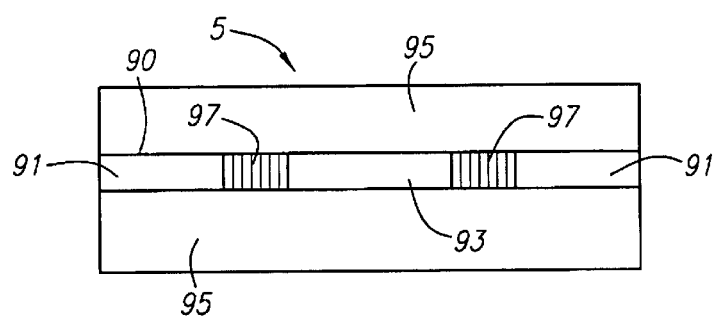
FIG. 12 illustrates a channel waveguide with periodic variations in the index of refraction that may be fabricated according to the present inventions.

FIGS. 11 and 12 show top views of channel waveguide devices 90 comprising regions 91 of low induced index of refraction change (low Δn) forming weekly guiding waveguides with numerical apertures matched to that of telecommunication fibers, coupled to regions 93 of high induced index of refraction change (high Δn) forming strongly guiding waveguides, which are coupled back to regions 91 of low induced index of refraction change (low Δn) forming weakly guiding waveguides. Thus, surrounding regions 95 have a lower index than both regions 91 and 93.

Between the high Δn and low Δn regions 93, 91 coupling regions 97, 99 are provided. In coupling regions 97 shown in FIG. 11, the refractive index is graded continuously, preferably adiabatically, to minimize or eliminate the reflections associated with abrupt changes in index of refraction. An alternative approach to minimizing reflections is illustrated in FIG. 12 where the coupling regions 99 are graded quasi-continuously to minimize reflections as the light transitions from the low Δn region 91 to the high Δn region 93 or vice-versa. In the quasi-continuous approach, coupling regions 99 include a series of small stepped or periodic changes in the refractive index so as to produce a quasi-continuous refractive index gradient between the two regions being coupled. The amount of loss that can be tolerated will determine the Δn of each step and the number of steps that should be employed. The combination of these types of waveguide structures allows low loss coupling of single mode fibers to the waveguide while still permitting the creation of regions with special index of refraction properties.

Figure 13:
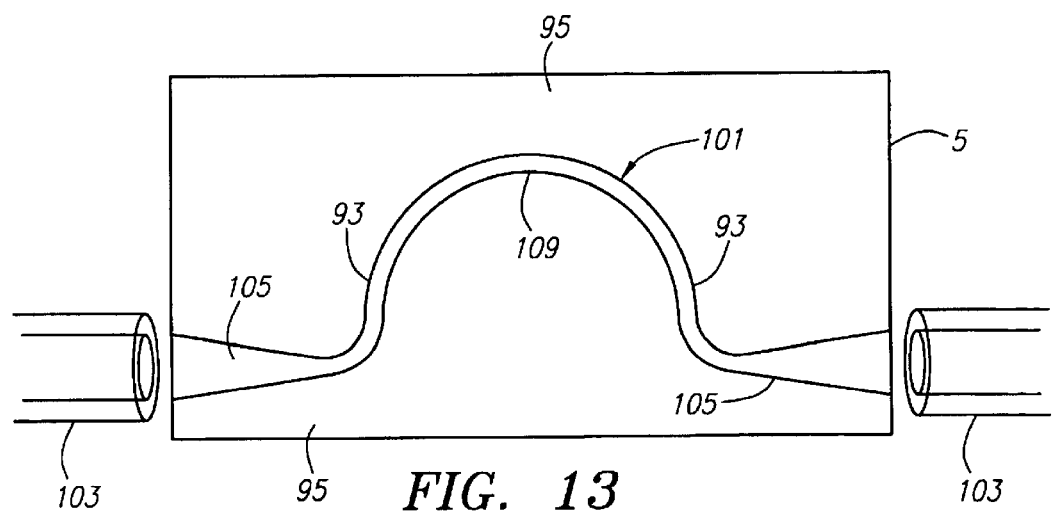
FIG. 13 illustrates a channel waveguide device with a non-linear geometry and varying indices of refraction that may be fabricated according to the present inventions.

FIG. 13 illustrates a waveguide 101 having a region 93 of high induced index of refraction change (high Δn) forming a strongly guiding waveguide. Because region 93 of waveguide 101 is a high Δn region, reduced waveguide dimensions may be used to propagate single mode light. In addition, tighter bends 109 are possible without increasing propagation losses. However, large losses would be experienced if high Δn region 93 were directly coupled to a standard weakly guiding fiber used in the telecommunications industry. But with the photosensitive sol-gel processes according to the present invention, the numerical apertures of waveguide 101 and weakly guiding single mode fiber 103 can be readily matched by adding a taper 105. Taper 105 includes a photoinduced continuous or quasi-continuous, and preferably adiabatic, refractive index gradient in the direction of light propagation to reduce or eliminate the reflections that would otherwise be associated with an abrupt change from the high Δn region to the low Δn region. This is useful in the fabrication of arrayed waveguide devices because each individual waveguide will require less space if they are more strongly guiding, thereby allowing more channels for a given substrate size.

The waveguide devices 90, 101 illustrated in FIGS. 11–13 may be readily written into the device layer 5 by employing a gray-scale photolithography mask during the exposure step. Alternatively, the devices may be imprinted using laser writing. As the device in FIG. 12 employs a periodic grading rather that a continuous grading to reduce reflections as the light propagates between the high and low Δn regions, successive exposures through differently shaped binary photolithography masks may also be used to write the image of waveguide 90.

Figure 14:
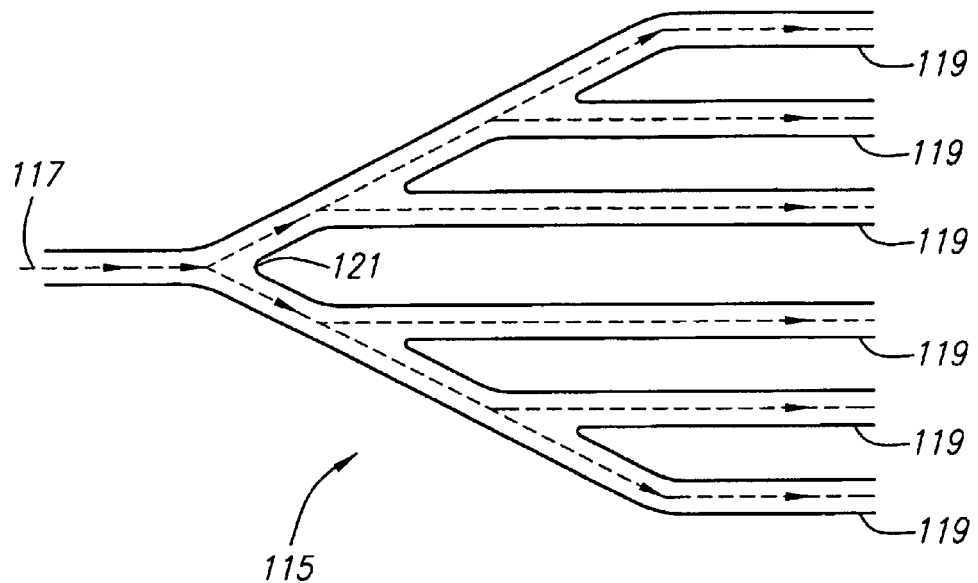
FIG. 14 illustrates a 1×6 splitter that may be fabricated according to the present inventions.

FIG. 14 shows a top-level view of another common optical device, a 1×6 splitter 115, which may be fabricated in a device layer 5 with the techniques outlined in FIG. 4 above. The 1×6 splitter splits one beam of light 117 into 6 channels 119. In order to fabricate a 1×6 splitter, or any n×m splitter, out of discrete components, individual fibers must be heated, drawn and fused with special care taken to assure that the width of each portion of the device is constant so that the power output of each channel is equal. An especially important part of a splitter is the spreader angle 121. For a splitter to divide the power of the incident light equally between each of the branches the angle of spread must be equal above and below the axis of symmetry. Additionally, the smaller the spreader angle, the less reflection occurs when incident light is split. With current methods of fabricating splitters, the etching and refilling steps compromise the fine control over the geometry of the spreader angle. However, with the present techniques, the geometry of the spreader angle 121 can be highly resolved and very tightly controlled, thus permitting both a very small spreader angle to minimize reflective losses and a symmetric angle above and below the axis of symmetry to minimize any asymmetric beam splitting.

The splitter shown in FIG. 14 may be written with a simple binary photolithography mask or a laser writing process.

Figure 15:
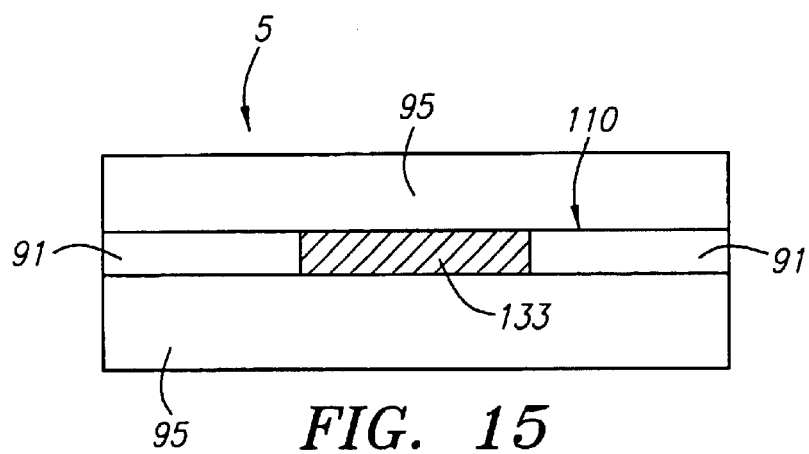
FIG. 15 illustrates an active channel waveguide device with a region where the index of refraction may be varied by application of an electric or magnetic field.

The optical devices of this invention are not limited to passive structures. FIG. 15, shows a top view of an active channel waveguide 110. Waveguide 110 comprises two passive regions 91 having fixed indices of refraction of low Δn so that they are weakly guiding. Waveguide 110 further comprises an active region 133 where the index of refraction may be varied by applying an electric or magnetic field, preferably region 133 can be made more strongly or more weakly guiding (i.e. exhibit a higher or lower Δn) when the electric or magnetic field is applied. Thus, surrounding regions 95 have an index of refraction that is less than regions 91 and 133.

Waveguide 110 may be formed in a device layer 5, for example, by adding two organometallic photosensitizers to the sol-gel mixture in step 23 of FIG. 4 above. The first photosensitizers may be selected to provide a photoproduced metal oxide that does not exhibit any or exhibits a reduced electro-optic or magneto-optic effects. For example, the first photosensitizer could be cyclopentadienyl titanium dichloride. The second photosensitizer would be selected to provide a photoproduced metal oxide that exhibits either a desired electro-optic or magneto-optic effect. For example, if an electro-optic effect is desired than trimethyltiniodide could be used as the second photosensitizer. On the other hand, if a magneto-optic effect is desired than ironpentacarbonyl could. Be selected as the second photosensitizer.

To write waveguide 110 into device layer 5, the photosensitive sol-gel film may be first exposed to light energy having a wavelength of approximately 535 nm to photolyze the cyclopentadienyl titanium dichloride. The light would be passed through a binary photolithography mask having a slit conforming to waveguide 110. Then in a second exposure step the photosensitive sol-gel film would be exposed to light energy of a wavelength of approximately 254 nm, if trimethyltiniodide is the second photosensitizer, or light energy of a wavelength of approximately 355 nm, if ironpentacarbonyl is the second photosensitizer, to photolyze the second photosensitizer. A binary mask conforming to region 133 is used to define the area of light exposure during the second exposure step. The image of the written device would then be fixed as previously described.

Because a preferred aspect of the invention permits the index of refraction to be spatially varied in the plane of the device layer 5 by varying the amount of photolyzing light energy delivered to the photosensitive sol-gel device layer by, for example, use of an appropriate photolithography mask, the photosensitive sol-gel processes of the present invention may be used to easily fabricate complicated interferometer devices.

Figure 16A:
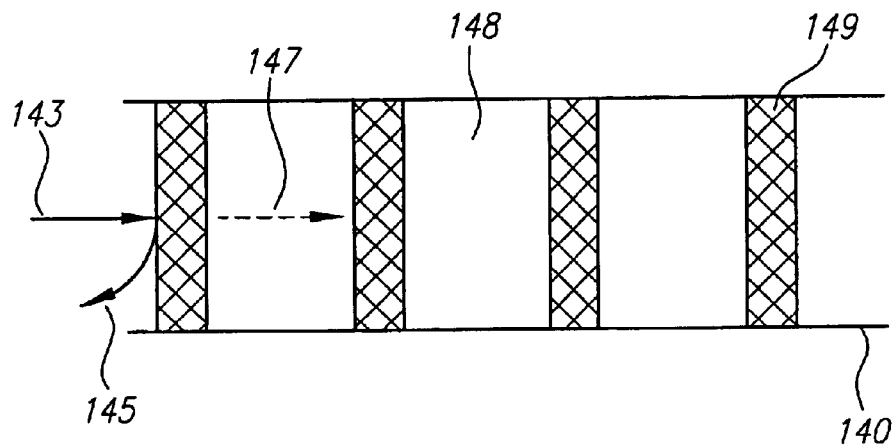
FIG. 16A is a cross sectional view through a prior art fiber Bragg grating.
Figure 16B:
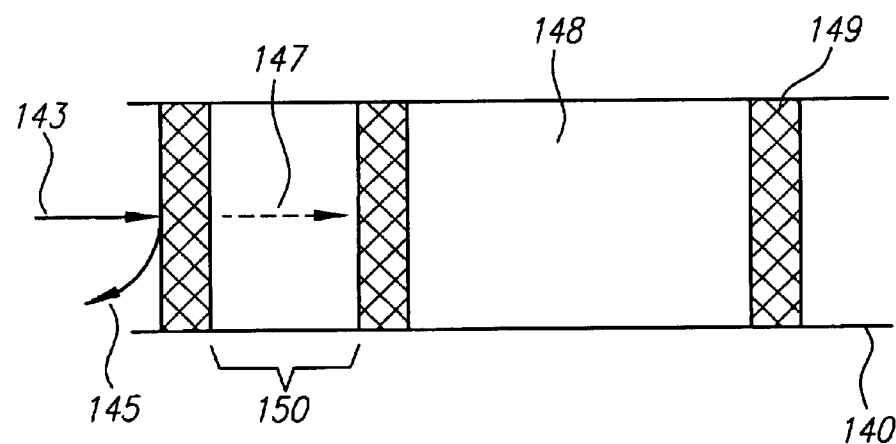
FIG. 16B is a cross sectional view through a prior art chirped fiber Bragg grating.

A basic element of many optical communications devices is the fiber Bragg grating (FBG). A FBG is the optical analog of a bandpass filter. A cross-sectional view through a prior art FBG is shown in FIG. 16A. In its simplest form, an FBG comprises a fiber 140 with a plurality of alternating regions 148,149. Regions 148 typically have a low index of refraction and regions 149 typically have a high index of refraction. As light 143 passes through the FBG, the light 143 is partially transmitted 147 and partially reflected 145 at each surface in which a change in the index of refraction is encountered by the propagating light. The resulting constructive/destructive interference allows the selective reflection and transmission of desired wavelengths. A prior art chirped FBG, as is shown in FIG. 16B, comprises a fiber 140, with regions 49 where the refractive index is constant, but the spacing 150 between regions 149 is different. In other words, the regions 148 vary in size in the direction of light propagation. The chirped FBG is useful for dispersion compensation in telecommunications systems.

Figure 17A:
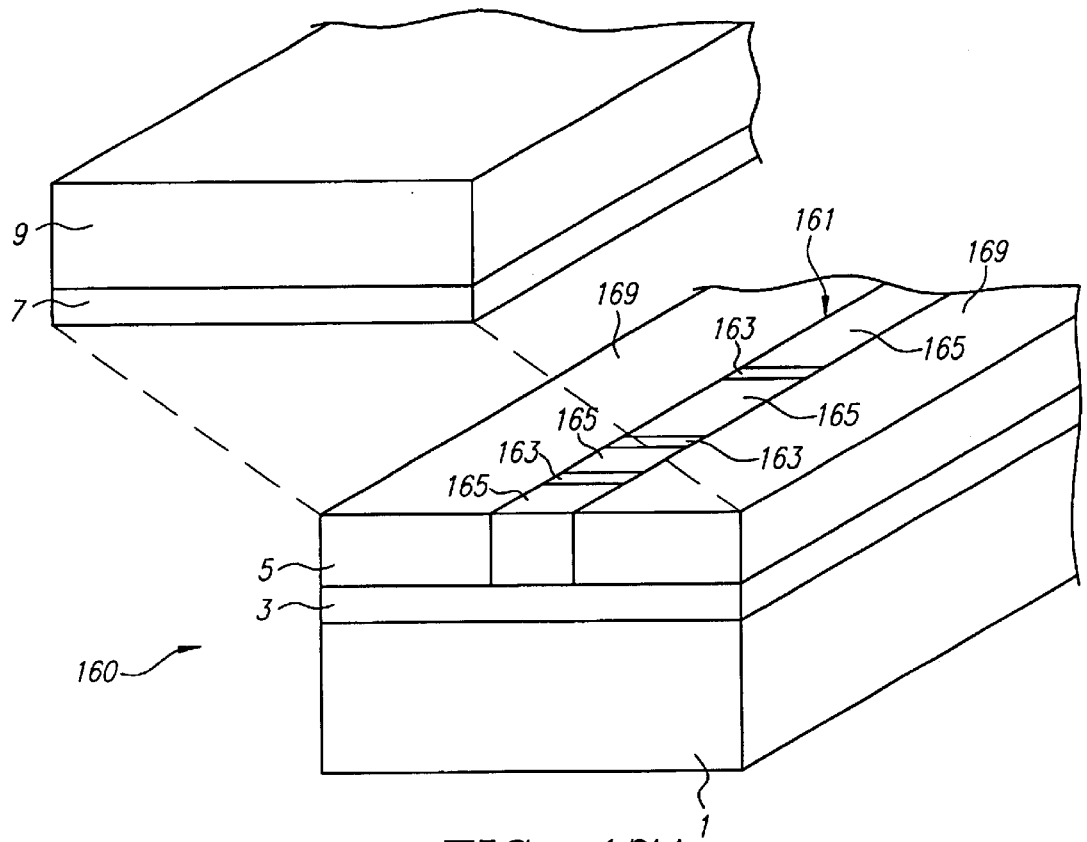
FIG. 17A illustrates an exploded partial perspective view of a waveguide Bragg grating device that may be fabricated according to the present inventions.

FIG. 17A is a partially exploded perspective view of an integrated optic device 160 according to the present invention that includes a chirped waveguide Bragg grating 161 embedded in device layer 5. The integrated optic device 160 comprises a planar substrate 1, a planar sol-gel derived buffer layer 3 characterized by an index of refraction n(b), a planar photosensitive sol-gel derived device layer 5 characterized by regions 163,165 with indices of refraction n(wg, I), n(wg,II), respectively, and surrounding regions 169 with an index of refraction of n(wg,II), a planar sol-gel derived cladding layer 7 characterized by an index of refraction n(c), and a planar protective layer. As with the conventional chirped FBG shown in FIG. 16B, the index of refraction of regions 163, 165 is constant, with regions 163 having a greater index of refraction than regions 165. Further, the indices of refraction for regions 163,165 are greater than that for surrounding regions 169 in device layer 5, the buffer layer 3, and the cladding layer 7.

The range of structures that may be employed for the substrate 1 and the processes for forming sol-gel derived buffer layer 3, photosensitive sol-gel derived device layer 5, sol-gel derived cladding layer 7 and protective layer 9 have been extensively discussed earlier and are equally applicable to the fabrication of integrated optic device 160.

One skilled in the art will appreciate that although FIG. 17A illustrates a chirped waveguide Bragg grating 161 with only three regions each for regions 163, 165, grating 161 may actually comprise a much larger plurality of these alternating regions. It will also be appreciated by those skilled in the art that an integrated optic device equivalent to the standard FBG illustrated in FIG. 16A may be fabricated using the processes according to the present invention.

In either instance, the image of the grating may be written into the photosensitive sol-gel film used to form device layer 5 by using a gray scaled photolithography mask, a phase mask, or by laser writing. Alternatively, a two step exposure may be employed using two binary masks. In the first exposure, a binary mask having a slit conforming to waveguide 161 would be used. Following the writing of a basic channel waveguide, a second binary photomask having slits corresponding to regions 163 would be used to photolyze additional photosensitizer in these regions, thus increasing the photoinduced refractive index in these regions.

Figure 17B:
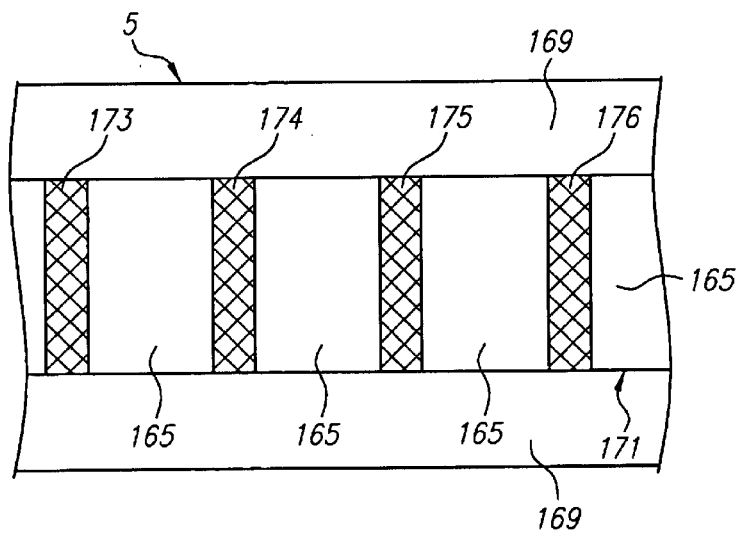
FIG. 17B illustrates a partial top view of a chirped waveguide Bragg grating that may be fabricated according to the present inventions.

FBGs have traditionally been manufactured by crossing two high powered laser beams over a fiber doped with germanium to burn the grating regions into the fiber. This process generally offers a fairly limited range of refractive indices that may be obtained for the grating regions. In contrast, the photosensitive sol-gel processes disclosed herein confer much more flexibility and utility. For example, the disclosed processes will allow a range of refractive indices to be photoinduced in regions 163. In addition, their spacing may be widely varied. Thus, as illustrated in part by the preferred chirped waveguide Bragg grating 171 illustrated in FIG. 17B, waveguide Bragg gratings according to the present invention offer a wider range of filtering profiles than is currently possible using conventional techniques. The chirped Bragg grating 171, includes regions 173, 174, 175, and 176 separated by equally spaced regions 165. The index of refraction of each of regions 173 through 176 is greater than that of the interposed regions 165. However, the index of refraction of each of regions 173 through 176 varies along the length of the grating. Thus, a chirped Bragg grating may be realized in which the grating elements are equally spaced.

As seen from above, the use of a photo mask to write a device image into a photosensitive sol-gel film permits easy control over the induced index of refraction, particularly in grating structures where the periodicity is typically submicron. Additionally, because the claimed invention allows the fabrication of very high index regions, relative to the index of refraction for diffractive elements of the current art, the grating structures according to the present invention may be made smaller; thus creating cost structure advantages relative to the current art.

Figure 18:
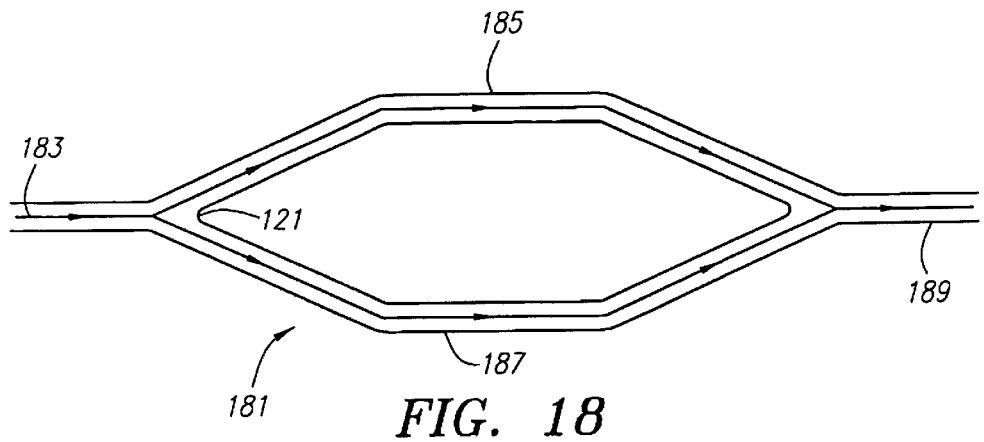
FIG. 18 schematically illustrates a top view of a Mach Zehnder interferometer that may be fabricated according to the present inventions.

FIG. 18 shows a top level view of a Mach-Zehnder (MZ) interferometer 181 that may be fabricated in a device layer 5 using the processes according to the present invention. MZ interferometers are a common optical component in optical networking gear. With the processes according to the present invention, however, MZ interferometers may be fabricated more cheaply and with improved functionality. In traditional MZ interferometers, a constant index of refraction is employed in the waveguide structure. Thus, a beam of light 183 is split along two channel guides 185, 187 and either constructively or destructively recombined in a third region 189 depending upon the difference in length between channel guides 185, and 187. In a preferred MZ interferometer according to the invention, however, channel guides 185, 187 of equal path lengths are used, and the index of refraction along either channel guide 185 or 187, or both, is varied along its path so that the propagating light beam 183 either constructively or destructively interferes when recombined in channel guide 189. In addition to a passive MZ interferometer, application of the methods used to fabricate and control active waveguides permits a tunable MZ interferometer by selectively doping one or both waveguides 185, 187 with an electro/magneto optical dopant and applying an electric/magnetic field to temporally vary an index of refraction.

Because a MZ interferometer can be understood as incorporating some of the same geometric considerations as a channel waveguide and a splitter, the discussion relating to the construction of those devices is also applicable here.

Because the photosensitive sol-gel processes of the present invention permit a high degree of control not only in defining high $\Delta n$ channels but also in controlling the index of refraction incrementally along the length of the channel and from channel to channel, multichannel devices such as wavelength division multiplexers (WDM) may be made richer in functionality, smaller and cheaper. A two-hundred and fifty-six channel wavelength division multiplexer, for example, can be made in a very small chip by tailoring the indices of refraction channel to channel and along the length of the channel such that there are very low losses and a small, or even no, radius of curvature in the individual channels. Moreover, the ends of the channels can be made with the desired dimensions and $\Delta n$ to match the model fields of the incoming/outgoing fibers to ensure high coupling efficiencies are achieved.

Figure 19:
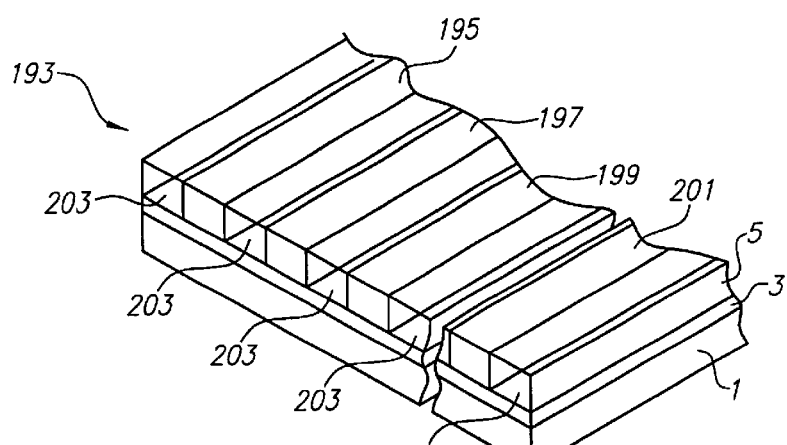
FIG. 19 illustrates a partial perspective view of an integrated arrayed waveguide device that may be fabricated according to the present inventions.

FIG. 19 is a partial perspective view of a preferred integrated optic arrayed waveguide 193 with four channels 195, 197, 199 and 201. The difference between the refractive index n of a given waveguide and the refractive index of the surrounding medium 203 ($n_1$) is $\Delta n_1$. Thus, the $\Delta n_1$ for channel 195 is $n_2-n_1$, the $\Delta n_2$ for channel 197 is $n_3-n_1$, the $\Delta n_3$ for channel 199 is $n_4-n_1$, and the $\Delta n_4$ for channel 201 is $n_5-n_1$.

Figure 20:
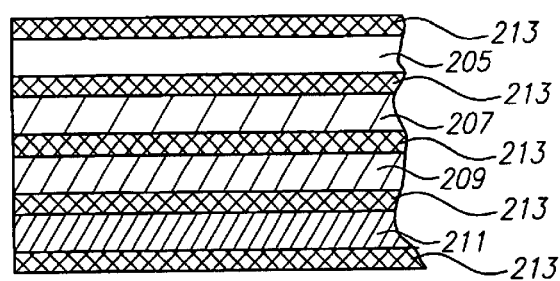
FIG. 20 illustrates a top view of a gray-scale photolithography mask that may be employed to fabricate the device in FIG. 19.

The fabrication process for the structure of FIG. 19 is essentially the same as that described above for the single channel waveguide device described in connection with FIGS. 9 and 10, except that a gray scale photo mask as shown in FIG. 20 is used in the exposure step. As can be seen from FIG. 20, the surrounding medium 203 between each of the waveguides correspond to the black regions 213 of the photomask. Thus, each waveguide in FIG. 19 is masked in varying gray scales from clear to light gray, to darker gray, to even a darker gray as shown by regions 205, 207, 209, 211 corresponding respectively to regions 195, 197, 199, and 201 in FIG. 19. Thus, the photoinduced refractive index changes will have the following relationship: $\Delta n_1 > \Delta n_2 > \Delta n_3 > \Delta n_4$.

An arrayed waveguide with more channels may be formed by masking with finer degrees of shading and/or using darker and darker masks as indicated in FIG. 20. The range of the mask for the channels may go from totally clear to almost completely black. The regions 203 between the channels are preferably masked with a black portion of the mask so that no light exposure occurs in these regions.

The use of the gray scale photo mask allows all of the channels to be written simultaneously. As will be appreciated, however, the individual channels may also be written using multiple binary masks and exposure steps, as well as laser writing.

The effect of spatially varied refractive index is based on the photochemistry of the photosensitive sol-gel film used to form device layer 5, where for each photon of photolyzing light, a photosensitive molecule is photolyzed and the metal radical is transformed into a metal oxide. Each of the metal oxide molecules induces a refractive index change in the sol-gel derived glass. Thus, the larger the number of photoproduced metal oxide molecules, the larger the refractive index change. Consequently, by using a gray scale photo mask, the index of refraction can be spatially varied in the device layer plane of the integrated optic device because the darker regions of the mask allow fewer photons to expose the photosensitive sol-gel film than the lighter regions of the mask.

This same procedure can be used in the fabrication of an array of curved waveguides with variable refractive indices. By controlling the refractive index of the curved waveguides (channels) during the light exposure process, arrayed waveguides may be produced with smaller and smaller minimum bending radii since the minimum effective bending radius in a waveguide is a function of the $\Delta n$ between a waveguide and the surrounding material. In contrast, in currently known structures, the index of refraction from waveguide to waveguide cannot be varied. As a result, all of the waveguides in the arrayed waveguide device have the same minimum effective bending radius.

Figure 21:
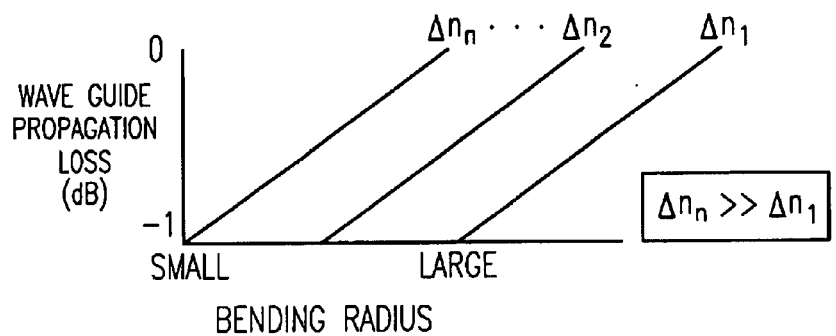
FIG. 21 is a graph illustrating waveguide propagation loss as a function of change in the index of refraction between the waveguide and the surrounding material Δn and the bending radius of the waveguide.

FIG. 21 is a graph of waveguide propagation loss (dB) versus radius of curvature. FIG. 21 teaches that for a given $\Delta n_n$ between the waveguide and surrounding material, propagation losses increase as the radius of curvature of the waveguide decreases. FIG. 21 also shows that the propagation losses associated with a small bend in a waveguide having a high $\Delta n$ ($\Delta n_n$) may be the same as the propagation losses associated with a large bend in a waveguide having a much smaller $\Delta n$ ($\Delta n_1$). Accordingly, because the present techniques allow the index to be adjusted for each channel, more compact waveguides may be fabricated without increasing propagation losses by simply increasing the index of refraction for each channel as the curvature of each channel increases.

Figure 22:
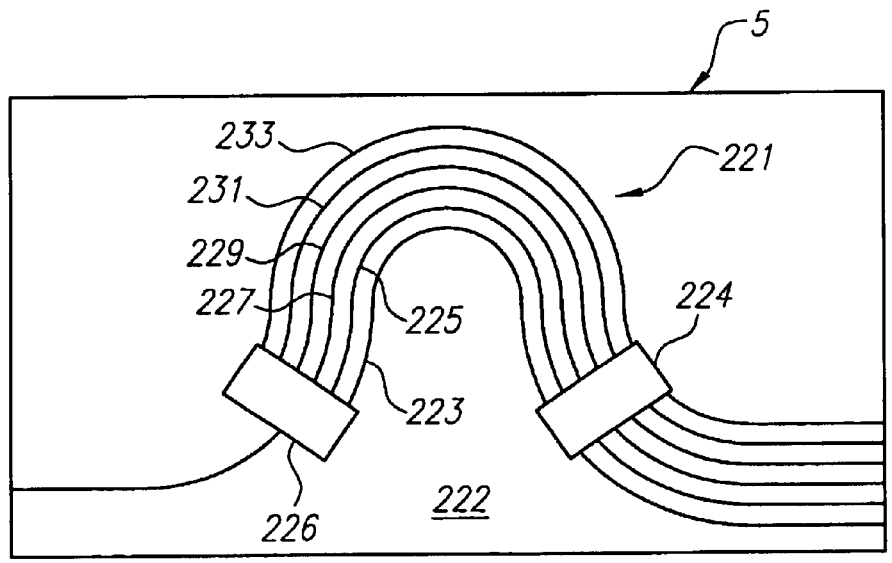
FIG. 22 is a schematic illustration of a curved arrayed waveguide that may be fabricated according to the present inventions for use in WDM applications.

FIG. 22 shows a schematic top view of a curved array waveguide 221 formed in a device layer 5. Curved array waveguide 221 comprises an array of curved waveguides 223, 225, 227, 229, 231 and 233 having their inputs connected to an input free propagation region coupler 226 and their outputs connected to an output free propagation region coupler 224. Waveguides 223 to 233 have photoinduced indexes of refraction with decreasing Δn values from surrounding region 222. Thus, the bending radii may become increasingly smaller from channel 233 to channel 223 without any increased propagation losses.

Because the minimum effective bending radius for a given waveguide is determined by the Δn between the waveguide and the material surrounding the waveguide, it will be appreciated that the same result may be obtained by forming a plurality of waveguides 223–233 having the same index of refraction and then controlling the refractive index of the material surrounding each of the waveguides. Under this approach, the refractive index of the surrounding material would be controlled so that the Δn values between the waveguide and surrounding material increases as the bending radii of the waveguides decrease.

The reason that arrayed wave guide gratings have been curved to date is that each of the channel waveguides forming the device have the same refractive index. Thus, different length channels are necessary to obtain the desired phase shift in the light propagating through the channel. However, with the photosensitive sol-gel process according to the present invention, it is possible to photoinduce sufficient refractive index changes in each of the channels 223–233 so that they can be made straight and of equal length between the input and output couplers 226, 224, while simultaneously producing the desired phase shift in each of the channels. This approach permits even a smaller arrayed waveguide grating to be produced.

As can be seen from the foregoing, the simultaneous control of the refractive index differential is particularly useful in the fabrication of dense and ultra-dense, variable-index, phase-array-waveguide gratings commonly used for fabricating integrated optic WDMs; this is because the WDM structure typically requires curved waveguides in the array. Thus, the use of a gray scale mask and the resulting ability to achieve a variable and controlled refractive index in such an array allows the fabrication of highly packed chips in a relatively small package.

Another common optical device is the 2×2 coupler. The 2×2 coupler couples some or all the light from one waveguide into a second waveguide or vice versa. Discrete 2×2 couplers are ordinarily formed by wrapping two fibers around each other and fusing them with heat. Since the coupling strength between two fibers is exponentially dependent upon the distance separating the fibers, the distance between the waveguides is critical. Achieving this degree of precision when fusing discrete components is the principal difficulty in manufacturing discrete couplers.

Figure 24:
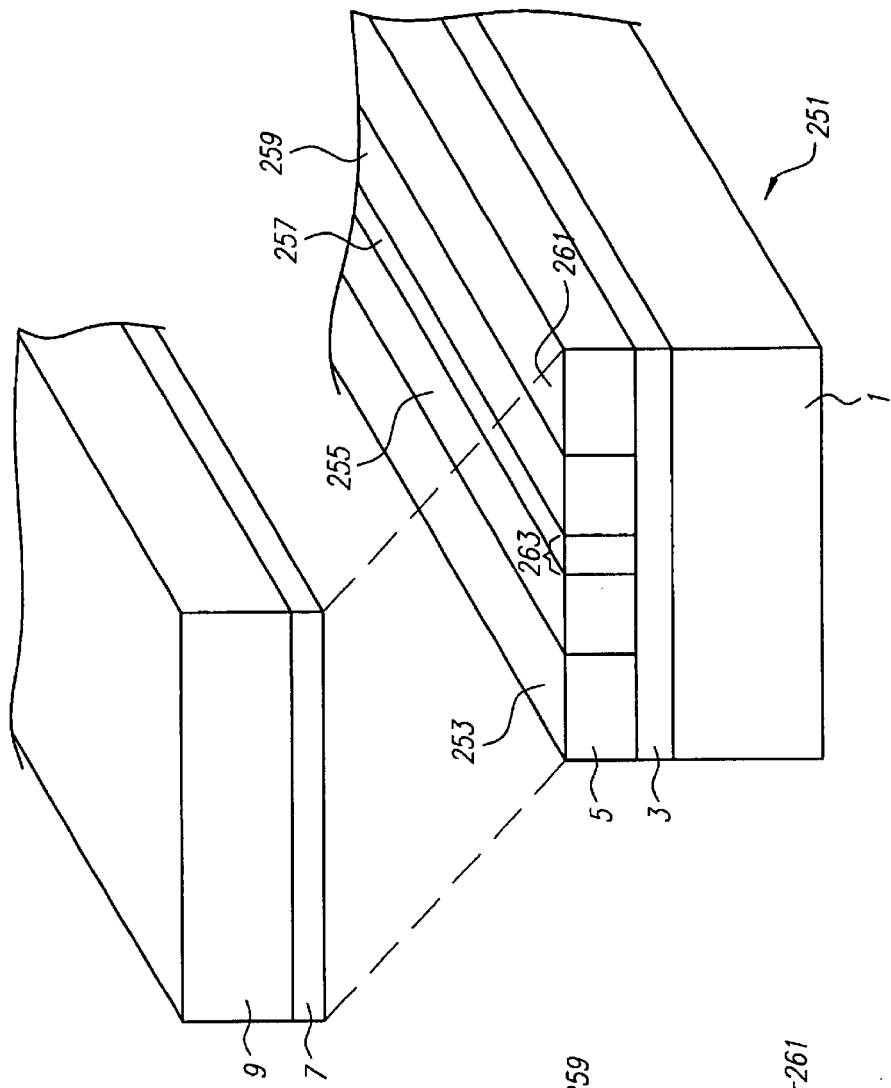
FIG. 24 illustrates a partial perspective view taken along line 24—24 of the device illustrated in FIG. 23.
Figure 23:
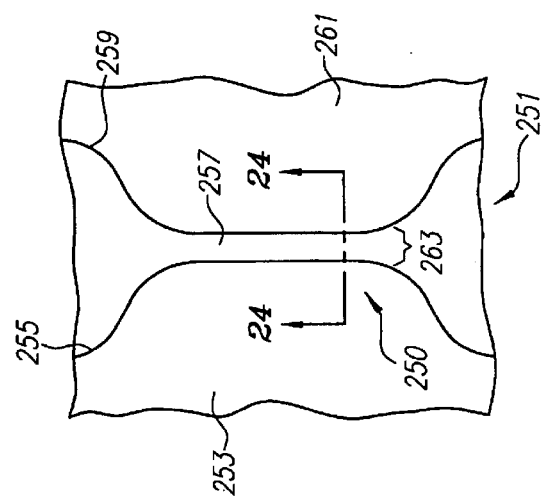
FIG. 23 schematically illustrates a top view of a 2×2 optical coupler that may be fabricated according to the present inventions.

FIGS. 23 and 24 illustrate an integrated optic device 251 according to the present invention that includes a photoinduced 2×2 coupler 250 embedded in a device layer 5. Integrated optic device 251 comprises: 1) a planar substrate 1; 2) a planar sol-gel derived buffer layer 3 characterized by an index of refraction n(b); 3) a planar photosensitive sol-gel derived device layer 5 characterized by regions 253, 255, 257, 259 and 261 characterized with indices of refraction n(wg,I), n(wg,II), n(wg,III), n(wg,IV) and n(wg,V), respectively; 4) a planar sol-gel derived cladding layer 7; and 5) a planar protective layer 9. The range of structures that may be employed for the substrate 1, sol-gel buffer layer 3, cladding layer 7 and protective layer 9 have already been extensively discussed.

Waveguides 255, 259 in conjunction with the region 257 interposed between the two waveguides defines 2×2 coupler 250. In a 2×2 coupler the degree of coupling is a function of four variables: 1) the index of refraction of the first waveguide 255; 2) the index of refraction of the second waveguide 259; 3) the index of the material between the waveguides 257 and 4) the distance between the waveguides 263. As will be appreciated from the description of the prior devices, with the photosensitive sol-gel processes described herein, each of these parameters may be selectively controlled in couplers of the instant invention. Thus, the 2×2 coupler fabricated in accordance with the present invention provides a number of distinct advantages over existing discrete and integrated 2×2 coupler designs.

First, because the distance between the couplers can be controlled to a high degree of precision and because the indices of refraction of each waveguide 255, 259 and the intermediate material 257 can be independently adjusted over a wide range, the couplers can be made more compact than known discrete or integrated optic couplers, while also offering a wider range of coupling strengths. Another advantage of 2×2 couplers of the present invention vis-A-vis existing integrated couplers, is that because the index of refraction can be independently varied in each waveguide 255, 259 it is possible to fabricate highly asymmetric 2×2 couplers.

In addition to the foregoing advantages, the following section will demonstrate that if a 2×2 coupler according to the present invention is doped with an electro/magneto active dopant, it is also possible to use the coupler as an optical switch.

If the device layer is doped with dopants that are electro-optically active such as tin oxide, lead oxide, titanium oxide, and zirconium oxide it is possible to fabricate electro-optical switches. If the glass matrix of the device layer is doped with dopants that are magneto-optically active such as iron, iron oxide, nickel and nickel oxide it is possible to fabricate magneto-optical switches. Doping with rare earth materials such as erbium oxide, neodymium oxide, ytterbium oxide and praseodymium oxide allows the fabrication of all optical switches that are switched with a light pump.

Figure 25:
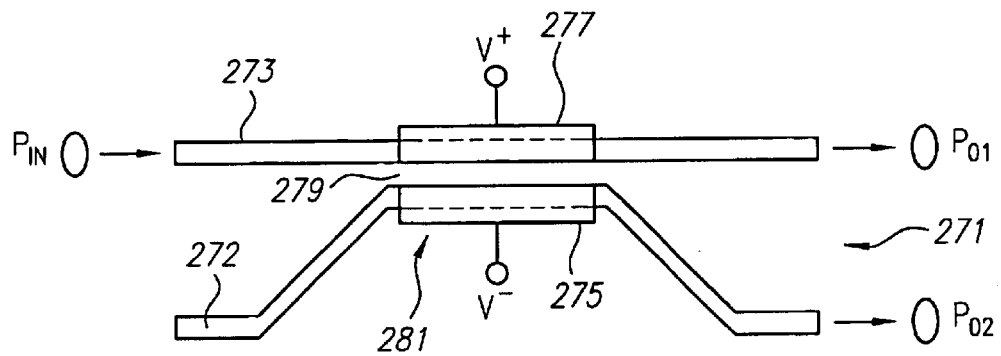
FIG. 25 schematically illustrates a top view of an electro-optical switch that may be fabricated according to the present inventions.
Figure 26:
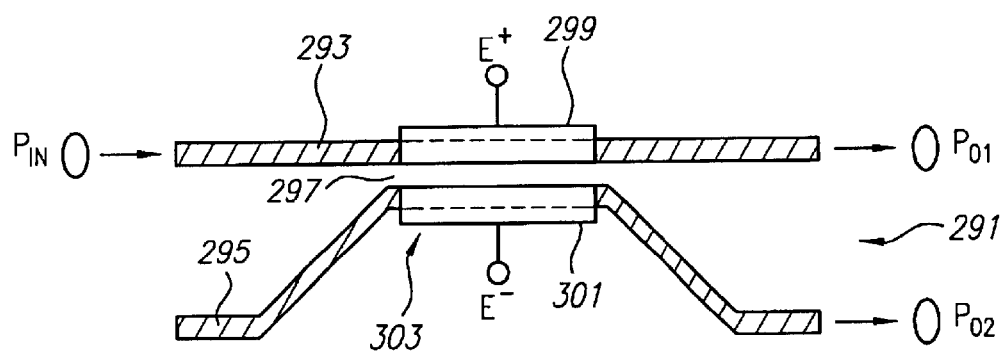
FIG. 26 schematically illustrates a top view of a magneto-optical switch that may be fabricated according to the present inventions.
Figure 27:
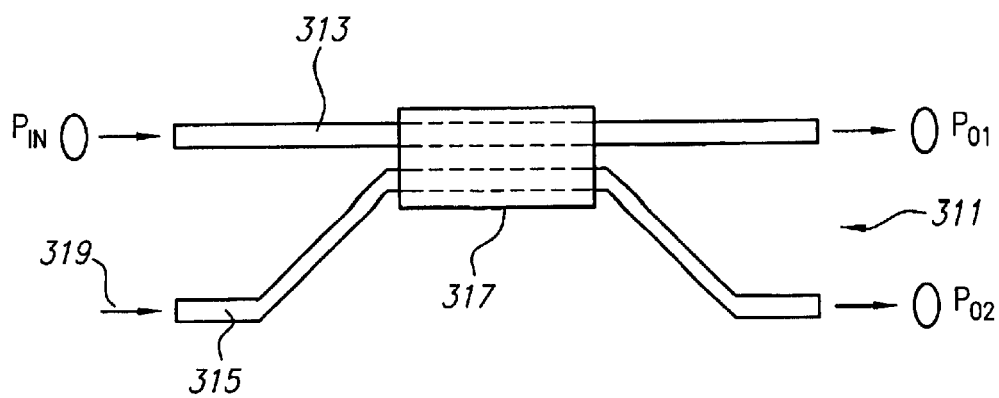
FIG. 27 schematically illustrates a top view of an optically pumped switch that may be fabricated according to the present inventions.

FIGS. 25–26 are optical switches based on the use of a 2×2 coupler where one or both waveguides have been doped with electro-active or magneto active dopants such that the application of an electric or magnetic field causes the index of refraction of one or both waveguides to vary permitting light to couple from one waveguide to another. FIG. 27 is a similar optical switch based on 2×2 coupler where one or both waveguides of the coupler have been doped with an active dopant such that upon one waveguide being pumped by a light source, the index of refraction of the waveguide being pumped is altered allowing light to couple between the waveguides in the coupler.

FIG. 25 is a schematic top view of an electro-optic switch 271 that may be fabricated in a device layer of an integrated optic device 2 according to the present invention. Electro-optic switch 271 includes first and second waveguiding channels 272 and 273 fabricated as described in connection with FIG. 4 or 8 above. One or both channels 272, 273, or the entire device layer itself, may be doped with an electro-optically active dopant by the methods previously described. In particular, channels 272, 273 may be doped with an electro-optically active dopant by employing an organometallic photosensitizer with an M constituent that confers electro-optic properties to imprinted waveguides 273, 272. The entire device layer may be made electro-optically active by including a suitable alkoxide precursor in the base sol-gel mixture used to form device layer 5.

Electrodes 275, 277 may be formed directly above or directly below channel 272 and channel 273 in coupling region 281. Alternatively, one electrode may be placed above the device layer and one below the device layer in coupling region 281. Yet another approach is to form electrodes 275, 277 adjacent to the waveguides within device layer 5. The electrodes are preferably positioned to maximize the interaction of the applied electric field with electro-optically active portions of the device layer.

When a voltage is applied to electrodes 275, 277, the applied electric field produces a localized change in the index of refraction that causes light, Pin, in channel 273 to exit channel 272 (Po2). Depending on where the device layer 5 is doped with the electro-optically active dopant, the index of refraction change may occur in: 1) one of channels 272, 273; 2) both of channels 272, 272; 3) the region 279 interposed between the channels; or 4) both channels 272, 273 and the intermediate region 279. In the absence of an applied electric field, the signal (Pin) exits channel 273 (Po1). Thus, a high-speed electro-optic switch is realized.

FIG. 26 is a schematic top view of a magneto-optic switch 291 that may be fabricated in a device layer of an integrated optic device 2 according to the present invention. Magneto-optic device 291 includes first and second waveguiding channels 293 and 295 fabricated as described in connection with FIG. 4 or 8 above. One or both channels 293, 295, or the entire device layer itself, may be doped with a magneto-optically active dopant by the methods disclosed earlier. In particular, channels 293, 295 may be doped with a magneto-optically active dopant by employing an organometallic photosensitizer with an M constituent that confers magneto-optic properties to imprinted waveguides 293, 295. The entire device layer may be made magneto-optically active by including a suitable alkoxide precursor in the base sol-gel mixture used to form device layer 5.

Magnets 299, 301 may be formed directly above or directly below channel 293 and channel 295 in coupling region 303. Alternatively, one magnet may be placed above the device layer and one below the device layer in coupling region 303. Yet another approach is to form magnets 299, 301 adjacent to the waveguides within device layer 5. The magnets are preferably positioned to maximize the interaction of the applied magnetic field with magneto-optically active portions of the device layer.

When a voltage is applied to magnets 299, 301, the applied magnetic field produces a localized change in the index of refraction that causes light, Pin, in channel 293 to exit channel 295 (Po2). Depending on where the device layer 5 is doped with the magneto-optically active dopant, the index of refraction change may occur in: 1) one of channels 293, 295; 2) both of channels 293, 295; 3) the region 297 interposed between the channels; or 4) both channels 293, 295 and the intermediate region 297. In the absence of an applied magnetic field, the signal (Pin) exits channel 293 (Po1).

FIG. 27 shows an all optical switch 311 with channels 313 and 315 that may be fabricated in a device layer of an integrated optic device 2 according to the present invention. The channels are in close proximity at region 317. Region 317 includes an optically active dopant. Region 317 may include only channel 315 or it may extend into channel 313. If pump light 319 is introduced at the input of channel 315, a signal Pin at the input of channel 313 exits channel 315 (Po2). In the absence of pump light, the signal exits channel 313 (Po1). Region 317 may be doped with an optically active dopant by including an organometallic photosensitizer with an M constituent that exhibits optical activity in the photosensitive sol-gel film that is used to form device layer 5 and then exposing region 317 to photolyzing light energy. Alternatively, the entire sol-gel derived glass matrix forming device layer 5 may be doped with an optically active dopant. This may, for example, be accomplished by adding one or more of the rare earth alkoxides described above to the sol-gel mixture prepared in step 19 of FIG. 4.

One skilled in the art will realize based on the earlier discussions regarding passive 2×2 couplers and optical switches based on 2×2 couplers, that the techniques of this invention permit a wide range of optical switches to be constructed. As discussed above, the coupling of light across a 2×2 coupler, or any tunneling based device, is a function of three variables in general: 1) the index of refraction of the waveguides the coupling occurs between (the classically allowed regions), 2) the index of refraction of the medium that the light tunnels through (the classically forbidden regions) and 3) the tunneling distance. Accordingly, an optical switch may be constructed if the index of refraction of either the classically forbidden regions, the classically allowed regions or both are varied by application of an applied field or fields. As such, there are few limitations on the geometry of the electro/magneto actively doped regions throughout the device. The regions doped with the electo/magneto active dopants may include the waveguiding portions of an optical switch, the region interposed between the waveguides, or both. The third variable, the tunneling distance, is easily controlled in the present invention relative to the prior art because of the superior device feature size resolution that may be obtained with the etch-free photolithography or laser writing exposure process employed in the present invention.

Although pure electro-optically active and magneto-optically active devices have been disclosed, these principals are perfectly applicable to a mixed field device employing both electric and magnetic fields, as well as optical fields. Additionally, multiple types of electro/magneto active dopants may be employed which may be sensitive to different applied field strengths. Thus, devices based upon multiple electric or magnetic fields are also within the purview of the current techniques.

There is also no limitation in these devices to the order of the response of the refractive index to the applied field strength. For many optical switch applications, a first order response (i.e., linear response) in the dielectric to the applied field strength is preferable, but for some applications higher order responses may be employed.

Figure 28:
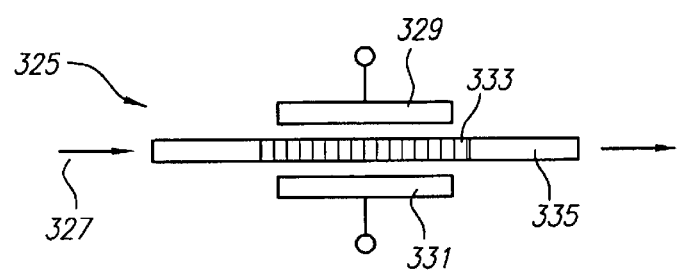
FIG. 28 schematically illustrates a top view of a tunable waveguide Bragg grating that may be fabricated according to the present inventions.

FIG. 28 illustrates a preferred tunable waveguide Bragg grating filter 325 that may be fabricated in a device layer 5 of an integrated optic device 2 according to the present invention. The figure shows a channel 335 that may be fabricated as discussed in connection with FIG. 4 or 8. The Bragg grating is indicated at 333 and electrodes 329 and 331 are located to produce an electric field to change the index of refraction in the channel at the grating. A photoproduced electro-optically sensitive dopant is included in waveguide 335 so that when a field is applied to grating 333, the grating tunes the Bragg wavelength that is filtered from the device. If the Bragg wavelength for a particular magnitude of applied field is $\lambda_x$, when that field is applied and an input signal 327 incident to the device contains wavelengths $\lambda_1, \lambda_2, \lambda_x \ldots \lambda_n$ then wavelength $\lambda_x$ will be filtered from the input signal and wavelengths $\lambda_1, \lambda_2, \ldots \lambda_n$ will exit channel 335.

The same generalities discussed in connection with the possible designs of waveguide Bragg gratings described earlier also apply to tunable Bragg grating 325. For example, the diffractive elements may have the same or different indices of refraction and the may be spaced periodically or irregularly throughout channel 335.

Figure 29:
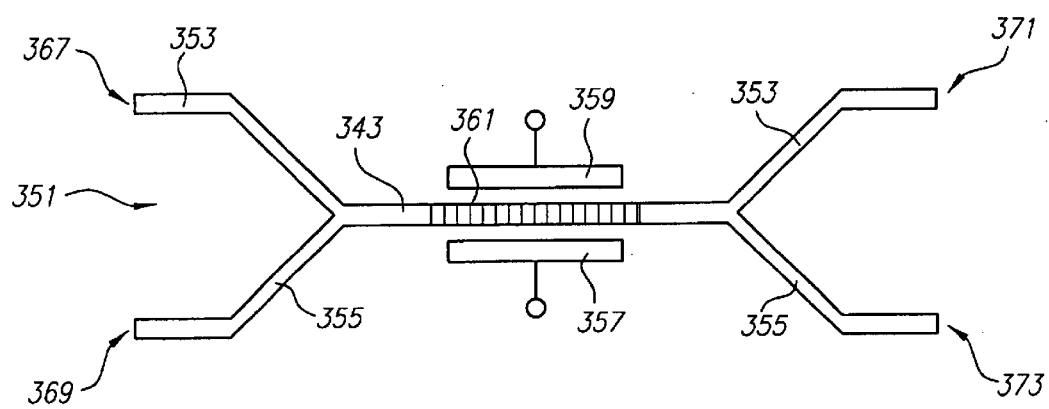
FIG. 29 schematically illustrates a top view of an add/drop device for wavelength division multiplexer that may be fabricated according to the present inventions.

FIG. 29 illustrates a tunable add/drop filter 351 that may be fabricated in a device layer of an integrated optic device 2 according to the present invention. Add/drop filter 351 may be fabricated as described in connection with FIG. 4 or 8 above. The filter includes channels 353 and 355 with a common section 363, which includes a Bragg grating 361. Electrodes 359 and 357 are positioned to generate an electric field that changes the index of refraction in section 361. A photoproduced electro-optically sensitive dopant is included in waveguide 343 so that when a field is applied to grating 361, the grating tunes the Bragg wavelength that is filtered from the device. If the tuned Bragg wavelength for a particular magnitude of applied field is $\lambda$hd x, when that field is applied and an input signal 367 containing wavelengths $\lambda_1, \lambda_2, \lambda_x \ldots \lambda_n$ is added to the device at 367, then wavelength $\lambda_x$ will be filtered from the input set so that wavelength $\lambda_x$ exits channel 355 at 369. Wavelengths $\lambda_1, \lambda_2, \ldots \lambda_n$ will pass through the Bragg grating and exit channel 353 at 371. Wavelength $\lambda_x$ may also be added at input 373 to channel 355, thereby causing it to exit channel 353 at 371.

FIGS. 25–29 are illustrative of active devices that employ electronic, magnetic or optic field control over the refractive indices of an integrated optical device. FIGS. 25–29 taken in conjunction with the passive devices outlined throughout the application demonstrate that a full range of dynamic or passive devices may be fabricated with the methods disclosed herein, including dynamic/passive modulators directional couplers, tunable gratings, and tunable add/drop filters. It will also be appreciated by those skilled in the art that the dynamic switching or tuning functions achieved in the devices illustrated in FIGS. 25–29 through the use of an electro/magneto optically active dopant, may also be achieved using thermo-optic effects. To employ thermo-optic switching or tuning in such devices, the electrodes illustrated in FIGS. 25–29 would simply be replaced with a heater as is known in the art. Furthermore, an electro/magneto active dopant would not need to be used.

Figure 30:
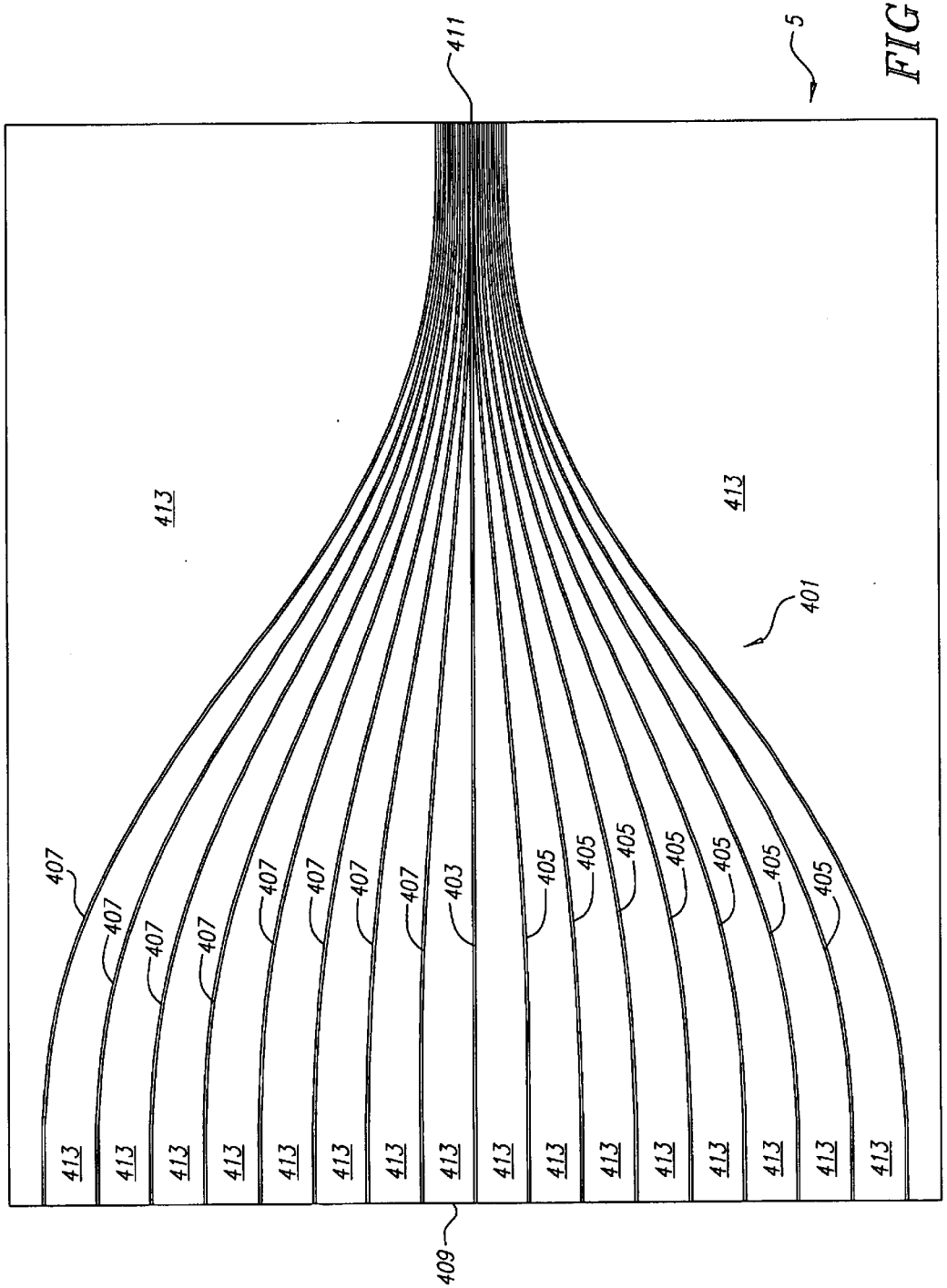
FIG. 30 schematically illustrates a top view of a fiber array concentrator fabricated in accordance with the present inventions.

FIG. 30 shows a schematic top view of a fiber array concentrator 401, which may be fabricated in a device layer 5 using the techniques outlined in FIG. 4 above. The fiber array concentrator 401 comprises a straight waveguide 403 along the device's axis of symmetry. On each side of waveguide 401 are a plurality of curved waveguides 405, 407. On the input end 409 of the fiber array concentrator, waveguides 403, 405, and 407 are spaced so that they may be coupled to standard optical fibers, preferably standard weakly guiding optical fibers used in the telecommunications industry. Curved waveguides 405, 407 then curve toward the axis of symmetry so that at the output end 411 of the fiber array concentrator 401 the array is spatially concentrated.

If waveguides 403, 405, 407 each have the same index of refraction and the surrounding regions 413 also have the same index of refraction, fiber array concentrator 401 may be written into device layer 5 using a binary photolithography mask in the exposure step. Alternatively, waveguides 403, 405, 407 may be imprinted using laser writing.

If the number of curved waveguides 405, 407 becomes sufficiently large, it may be desirable to increase the refractive index of the curved waveguides as their distance from center waveguide 403 increases. This may be desirable so that tighter bending radii may be used on the outer waveguides without increasing propagation losses. Furthermore, by employing tighter bending radii in the outer waveguides, fiber array concentrator 401 may be used to spatially concentrate light propagating through larger fiber arrays over shorter distances.

Figure 31:
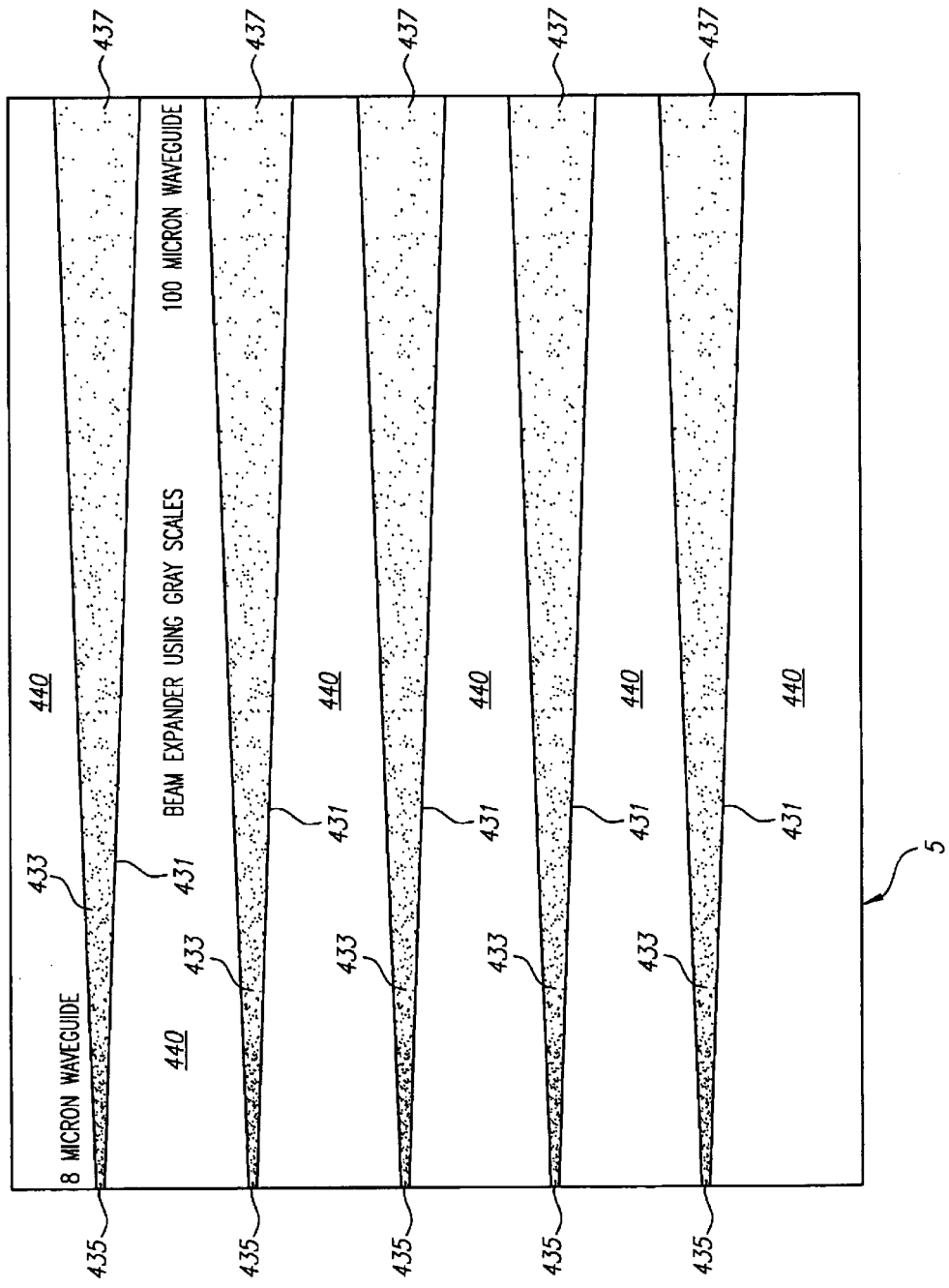
FIG. 31 schematically illustrates a top view of one embodiment of a beam expander or beam concentrator fabricated according to the present inventions.
Figure 32:
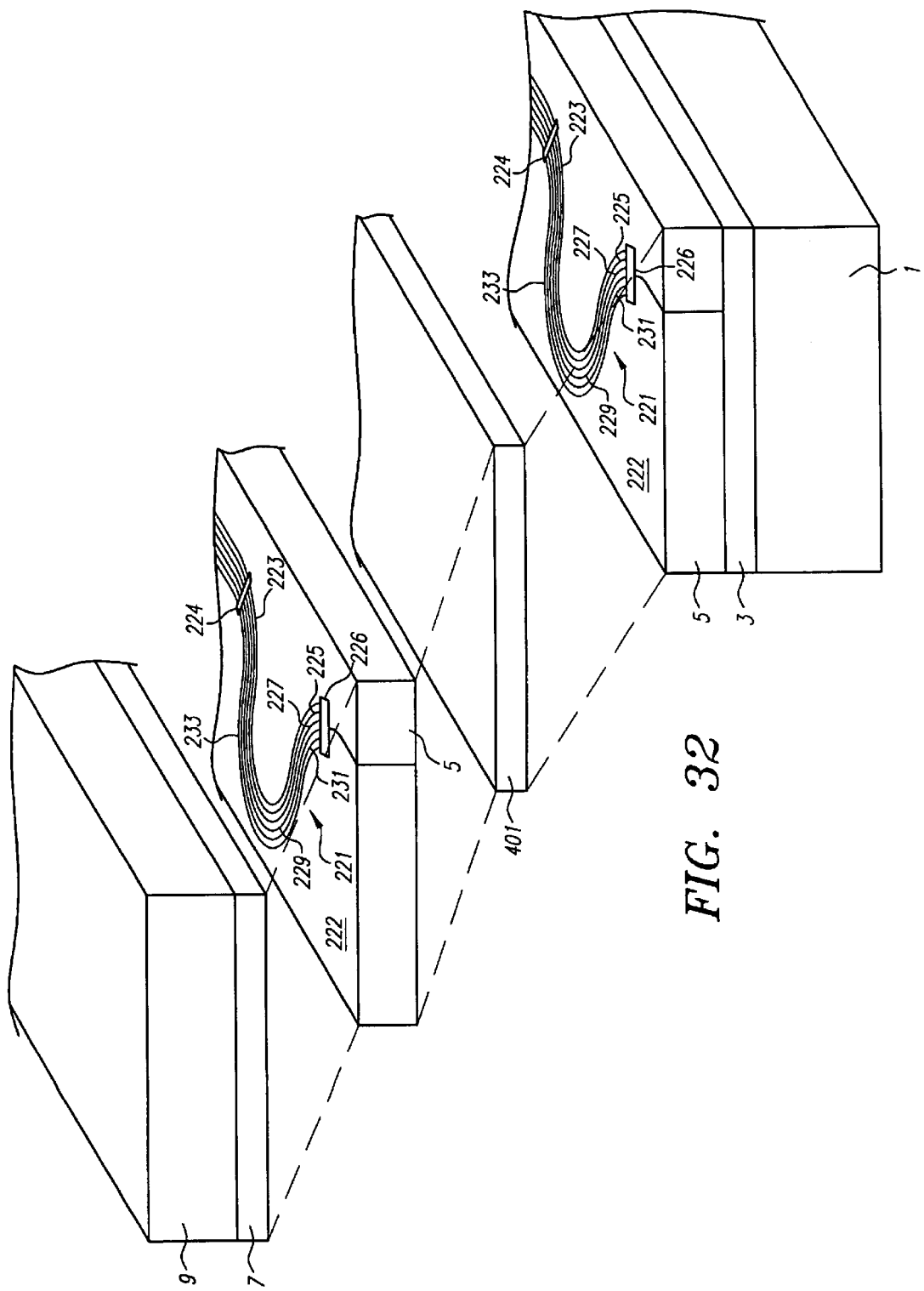
FIG. 32 is an exploded schematic representation of an integrated optic device comprising two device layers fabricated in accordance with the present inventions, each device layer including an array of curved waveguides such as those shown in FIG. 22.

FIG. 31 schematically illustrates the top view of a plurality of beam expanders 431 embedded in a device layer 5. Each of the beam expanders 431 comprise a tapered waveguide 433 embedded in the surrounding regions 440 of the device layer. Tapered waveguides 433 comprise an input end 435 and an output end 437. Between the input and output ends, waveguides 433 are tapered so as to expand the energy distribution of the light propagating through the beam expander. To maintain the same number of propagation modes within the waveguide, however, the refractive index of the beam expander is decreased as its width increases. In other words, the waveguide is made less weakly guiding as its width expands. Furthermore, the refractive index is preferably graded continuously or quasi-continuously from $n_1$ at the input end 435 to $n_0$ at the output end 437 to minimize or eliminate the reflections associated with abrupt changes in the index of refraction. In the present embodiment, surrounding regions 440 preferably have a uniform refractive index.

Beam expanders 433 may be used, for example, to couple light from a fiber array or waveguide array to a free propagation region. Thus, for example, input end 437 may be 8 μm wide and have a thickness of 8 μm and an index of refraction of approximately 1.43 so that it may efficiently couple with a standard weakly guiding telecommunications fiber (not shown). The light from the fiber may then be expanded to have a desired beam profile. For example, beam expanders 431 may expand the input beam profile by a factor of 2 to a factor 15 or more in the plane of the device layer. The refractive index $n_0$ at the output end 437 will be determined by the amount of beam expansion desired and the number of propagation modes desired. Thus, for example, if input end 435 is coupled to a single mode fiber and single mode propagation is desired throughout beam expander 431, then the refractive indices of the input and output ends 435, 437 will be set so that the Δn at these ends is consistent with single mode propagation. The refractive index of the beam expander is then continuously or quasi-continuously graded in the direction of propagation so as to maintain single mode propagation throughout the beam expander while also minimizing or eliminating the reflection associated with abrupt changes in the refractive index.

Beam expanders 431 may be fabricated in a device layer 5 using the techniques outlined in FIG. 4 above. If a beam expander having a continuously graded refractive index is desired, then a gray scale photolithography mask with a continuous gradient is preferably used to write the desired gradient in the photosensitive sol-gel used to make device layer 5. Alternatively, beam expanders 431 may be written by laser writing.

If the included photosensitizer increases the refractive index of the sol-gel following the exposure and fixing steps, then the raster rate of the laser would be slowly decreased as the laser propagates from the input end of the device to the output end of the device. Similarly, in the case of a gray scale mask, the mask would be continuously graded so that the amount of light transmitted through the mask is continuously decreased from the input end of the device to the output end of the device. In contrast, if the photosensitizer that is used in the photosensitive sol-gel glass material used to form device layer 5 induces a decrease in the refractive index upon photolysis, then the negative of the device image would be written. As a result, the input end would be delivered less photolyzing light energy than the output ends of the device. In this case, it would also be necessary to expose the surrounding regions 44 to the photolyzing light energy so as to photoinduce a decrease in the refractive index in these regions as well.

If a quasi-continuous index gradient is used between the input and output ends of the beam expander, then the device may also be written using a series of binary masks. However, this approach is less desirable then using a gray scale mask or laser writing process to imprint the image of the device in the device layer.

Although devices 431 function as beam expanders when light is input into the device from end 435, it will be appreciated that devices 431 may also function as beam concentrators if light is input into the devices from end 437. Thus, both an integrated beam expander and an integrated beam concentrator may be readily realized using the photosensitive sol-gel processes described herein.

In addition to fabricating integrated optical devices comprising a single device layer, the present techniques allow for the fabrication of integrated optical devices comprising multiple device layers. FIG. 30 illustrates a preferred monolithically integrated optical device comprising: 1) a substrate 1; 2) an optional buffer layer 3; 3) a stack of at least two photosensitive sol-gel derived device layers 5 with each device layer separated by an intermediate buffer layer 401; 4) an optional cladding layer 7 disposed on the stack of device layers; and 5) an optional protective layer 9.

The same range of embodiments that have been described above as being applicable to a single device layer optical device are also applicable to the multidevice layer integrated optic device shown in FIG. 30. Each device layer may be formed from a photosensitized sol-gel solution which has been imprinted with an optical device by exposure to patterned light energy and then fixed to form a photoproduced metal oxide modified glass matrix in the region of exposure. Each of the various layers may be formed using the processes described herein. For example, buffer layers 3 and 401 may be formed as described in connection with FIG. 3. Device layers 5 may be formed using the methods disclosed in connection with FIGS. 2, 4, and 8–10. Optional cladding layer 3 may be formed as described in connection with FIG. 5. And, optional protective layer 9 may be formed pursuant to the methods disclosed in connection with FIG. 6.

The optical devices included in each device layer may be connected in series or in parallel by external optical fiber(s) (not shown). FIG. 30 illustrates an optical device containing two arrayed waveguides 221 as described in connection with FIG. 22. However, there are no inherent limitations on the type of devices that may comprise each device layer 5. With the present technique complex optical processing, including splitting, switching, filtering and tuning of an optical signal may be accomplished in a single integrated optical device by varying the type of devices and connectivity of the devices between the device layers 5.

A multilayered device as shown in FIG. 30 is relatively easy to fabricate because of the variety of materials available, the use of photolithography (including gray scale masks) or laser writing to imprint the device image, the fact that embedded optical devices are produced without having to first produce a topographic device, the fact that films as thick as 10 μm or more can be readily produced in a single coating step without cracking, and the fact that the various layers do not shrink laterally during their curing or fixing steps.

Although the invention has been described with reference to preferred embodiments and specific examples, it will be readily appreciated by those skilled in the art that many modifications and adaptations of the invention are possible without deviating from the spirit and scope of the invention. Thus, it is to be clearly understood that this description is made only by way of example and not as a limitation on the scope of the invention as claimed below.

What is claimed is:

1. An integrated optic device comprising:
  a. a substrate;
  b. a planar photosensitive sol-gel derived glass optical device layer disposed on said substrate, said optical device layer including an embedded optical device, wherein the process of forming said device layer comprises i.) preparing a photosensitive sol-gel glass material that includes a highly volatile photosensitizer, ii.) producing a film of said photosensitive sol-gel on at least a portion of said substrate, iii.) imprinting said photosensitive sol-gel film with an image of said optical device by exposing at least a portion of said photosensitive sol-gel film to light energy patterned in the positive or negative image of said device to photolyze photosensitizer within the exposed portion, and iv.) fixing the image of said optical device in said exposed sol-gel film.

2. The integrated optic device according to claim 1, wherein said optical device includes regions having different indices of refraction.

3. The integrated optic device according to claim 1, wherein said optical device layer includes at least three regions having different indices of refraction, at least two of which are photoinduced.

4. The integrated optic device according to claim 1, further comprising a buffer layer interposed between said substrate and said device layer.

5. The integrated optic device according to claim 4, wherein said buffer layer comprises a second sol-gel derived glass material.

6. The integrated optics device according to claim 5, wherein said buffer layer is at least 2 μm thick and is less than or equal to 20 μm thick.

7. The integrated optics device according to claim 6, wherein said buffer layer is formed from a single film of said second sol-gel glass material.

8. The integrated optic device according to claim 1 further comprising a cladding layer disposed on said device layer.

9. The integrated optic device according to claim 8, wherein said cladding layer comprises a third sol-gel derived glass material.

10. The integrated optics device according to claim 9, wherein said cladding layer is at least 2 μm thick and is less than or equal to 20 μm thick.

11. The integrated optics device according to claim 10, wherein said cladding layer is formed from a single film of said third sol-gel glass material.

12. The integrated optic device according to claim 8 further comprising a protective layer disposed on said cladding layer, said protective layer forming a moisture barrier layer.

13. The integrated optic device according to claim 12 wherein said protective layer is from 5 μm thick to 100 μm thick.

14. The integrated optic device according to claim 13, wherein said protective layer comprises a polymer coating.

15. The integrated optic device according to claim 14, wherein said polymer coating comprises a polymer selected from the group consisting of poly-methyl-methacrylate (PMMA), poly-vinyl-acrylate (PVA), poly-vinyl-chloride (PVC) and poly-tetra-flouroethylene.

16. The process according to claim 14, wherein said protective layer is transparent.

17. The integrated optic device according to claim 12, wherein said protective layer comprises a metal coating.

18. The integrated optic device according to claim 1, wherein said photosensitizer is an organometallic photosensitizer having the form R-M-X, where R is a branched, unbranched or cyclo-alkyl group each of less than 20 carbons, M is a metal or semi-metal, and X is a photo labile moiety selected from the group of halogens and carbonyls (CO).

19. The integrated optic device according to claim 18, wherein the photosensitive sol-gel derived glass matrix in the exposed portion of said device layer is modified by a photoproduced oxide of a metal or semi-metal, wherein the metal is selected from the Group IVA, VA, VIA, VIIA, VIIIA, IIB, IIIB, IVB, and VIB metals and rare earth metals and the semi-metal is selected from the semi-metals within the Group IIIB, IVB, VB, and VIB elements.

20. The integrated optic device according to claim 19, wherein the photoproduced oxide is an oxide of a metal or semi-metal selected from the group consisting of Ge, Sn, Pb, Se, Te, Fe, Co, Ni, Ti, Zn, Nd, Er, Eu, Pr, Th, B, Si, and P.

21. The integrated optic device according to claim 1 or 8, wherein said photosensitizer has a vapor pressure greater than or equal to approximately 20 mm Hg at 25° C.

22. The integrated optic device according to claim 1, wherein said device layer is at least 2 µm thick and is less than or equal to 20 µm thick.

23. The integrated optic device according to claim 1 wherein said device layer is formed from a single film of said photosensitive sol-gel glass material.

24. The integrated optic device according to claim 23, wherein said device layer is at least 4 µm thick.

25. The integrated optic device according to claim 23, wherein said device layer is at least 6 µm thick.

26. The integrated optic device according to claim 1 or 23, wherein said preparing step further comprises adding a polysilane plasticizer to said photosensitive sol-gel glass material and said photosensitive sol-gel derived glass matrix includes a plurality of Si atoms having an R group bonded thereto, wherein R=H, Me, Et, Pr, i-Pr, n-Bu, i-Bu, t-Bu, hexyl, octyl, decyl, dodecyl, vinyl, phenyl, benzyl, chloromethyl, and chloromethylphenyl.

27. The integrated optic device according to claim 1, wherein said embedded optical device comprises a waveguide.

28. The integrated optic device according to claim 1, wherein said embedded optical device comprises at least one optical device selected from the group consisting of a channel waveguide, a coupler, a splitter, a filter, a combiner, a fiber spacing concentrator, a beam expander, a beam concentrator, an optical add-drop, an arrayed waveguide, and a diffraction grating.

29. The integrated optic device according to claim 19, wherein the exposed portion of said device layer comprises at least two regions having different concentrations of the photoproduced oxide.

30. The integrated optic device according to claim 1, further comprising a photoinduced $\Delta n$ value of at least 0.07% between the embedded optical device and a surrounding region of said device layer.

31. The integrated optic device according to claim 1, further comprising a photoinduced $\Delta n$ value of at least 0.14% between the embedded optical device and a surrounding region of said device layer.

32. The integrated optic device according to claim 1, wherein said embedded optical device includes a photoinduced continuously graded refractive index region graded from a first index value to a second index value.

33. The integrated optic device according to claim 1, wherein said embedded optical device includes a photoinduced quasi-continuously graded refractive index region graded from a first index value to a second index value.

34. The integrated optic device according to claim 1, wherein said embedded optical device comprises a waveguide and said waveguide includes different photoinduced indices of refraction along its axis.

35. The integrated optic device according to claim 1, further comprising a second buffer layer disposed on said device layer and a second planar photosensitive sol-gel derived glass optical device layer disposed on said second buffer layer, said second device layer including a second optical device embedded therein.

36. The integrated optic device according to claim 1 wherein said substrate comprises a semiconductor substrate.

37. An integrated optic device comprising:
   a. a substrate; and
   b. a photosensitive sol-gel derived glass device layer disposed on said substrate, said device layer comprising an embedded optical device and a surrounding region with different indices of refraction, wherein the $\Delta n$ between said device and said surrounding region is at least 0.001, the $\Delta n$ results from different concentrations of a photoproduced oxide being incorporated into the glass matrix of said device layer in the regions forming said device and said surrounding region, and wherein said device layer is formed from a photosensitive sol-gel film that is at least 2 βm thick.

38. An integrated optic device according to claim 37, wherein the $\Delta n$ between said device and said surrounding region is greater than or equal to 0.002.

39. An integrated optic device according to claim 37, wherein said device layer includes a plurality of Si atoms having an R group bonded thereto, wherein R=H, Me, Et, Pr, i-Pr, n-Bu, i-Bu, t-Bu, hexyl, octyl, decyl, dodecyl, vinyl, phenyl, benzyl, chloromethyl, and chloromethylphenyl.

40. An integrated optic device comprising:
   a. a substrate; and
   b. a photosensitive sol-gel derived glass device layer disposed on said substrate, said device layer comprising an embedded optical device and a surrounding region with different indices of refraction, said optical device including a photoinduced continuously graded refractive index region that is graded from a first index value to a second index value.

41. An integrated optic device comprising:
   a. a substrate; and
   b. a photosensitive sol-gel derived glass device layer disposed on said substrate, said device layer comprising an embedded optical device and a surrounding region with different indices of refraction, said optical device including a photoinduced quasi-continuously graded refractive index region that is graded from a first index value to a second index value.

42. An integrated optic device comprising:
   a. a substrate; and
   b. a photosensitive sol-gel derived glass device layer disposed on said substrate, said device layer comprising an embedded optical device and a surrounding region with different indices of refraction, said optical device comprising a waveguide having different photoinduced indices of refraction along its axis.

43. An integrated optic device comprising:
a. a substrate;
b. a photosensitive sol-gel derived glass device layer disposed on said substrate, said device layer comprising a plurality of embedded waveguides, each waveguide having an index of refraction greater than the index of refraction of regions immediately adjacent to said waveguides, wherein the Δn value between each waveguide and its corresponding adjacent regions is different than that of the other waveguides in the plurality.

44. An integrated optic device comprising:
a. a substrate; and
b. a photosensitive sol-gel derived glass device layer disposed on said substrate, said device layer comprising an embedded tapered waveguide and a surrounding region, said tapered waveguide having a first end and a second end, the second end being wider than the first end, wherein said tapered waveguide includes a photoinduced refractive index gradient that is graded from a first index value at the first end to a second index value at the second end, and wherein the first index value is greater than the second index value.

* * * * *